(12) United States Patent
Schwartz et al.

(10) Patent No.: US 9,349,899 B2
(45) Date of Patent: May 24, 2016

(54) MODULAR SOLAR SYSTEMS FACILITATING RAPID ASSEMBLY

(71) Applicant: SAHAR G.N. INTERNATIONAL LTD., Herzeliya (IL)

(72) Inventors: Eli Schwartz, Herzeliya (IL); Steven Shamash, Netanya (IL); Robert Landon Roach, Ramat HaSharon (IL); Giora Nir, Herzeliya (IL)

(73) Assignee: SAHAR G.N. LTD., Herzeliya (IL)

( * ) Notice: Subject to any disclaimer, the term of this patent is extended or adjusted under 35 U.S.C. 154(b) by 331 days.

(21) Appl. No.: 14/019,472

(22) Filed: Sep. 5, 2013

(65) Prior Publication Data

US 2014/0048121 A1 Feb. 20, 2014

Related U.S. Application Data

(63) Continuation-in-part of application No. 12/921,255, filed as application No. PCT/IL2009/000283 on Dec. 3, 2009, now abandoned, application No. 14/019,472, which is a continuation-in-part of application No.

(Continued)

(51) Int. Cl.
*F24J 2/12* (2006.01)
*F24J 2/24* (2006.01)

(Continued)

(52) U.S. Cl.
CPC .............. *H01L 31/058* (2013.01); *F24J 2/055* (2013.01); *F24J 2/07* (2013.01); *F24J 2/1057* (2013.01);

(Continued)

(58) Field of Classification Search
CPC ............ H01L 31/0547; F24J 2/38; F24J 2/12; F24J 2/24; F24J 2/055; F24J 2/07; F24J 2/1057; F24J 2/14; F24J 2/51; F24J 2/5233; F24J 2/541; F24J 2002/108; F24J 2002/4669; H02S 40/44; Y02E 10/52; Y02E 10/60; Y02E 10/44; Y02E 10/41; Y02E 10/45; Y02E 10/47; Y10T 29/49355
USPC ................................... 136/246, 248; 126/600
See application file for complete search history.

(56) References Cited

U.S. PATENT DOCUMENTS 3,952,725 A * 4/1976 Edmondson ............. F24J 2/268
126/659
4,091,473 A 5/1978 Matthews
(Continued)

FOREIGN PATENT DOCUMENTS

WO WO 2005090873 A1 * 9/2005 ............. F24J 2/0015

OTHER PUBLICATIONS

Non-Final Office Action for related U.S. Appl. No. 13/988,324, dated Nov. 1, 2013.

(Continued)

*Primary Examiner* — Devina Pillay
(74) *Attorney, Agent, or Firm* — Polsinelli PC

(57) ABSTRACT

A solar system for collecting solar energy, adapted to be rapidly assembled on site. The modular solar system includes a solar energy collector-assembly, having two wings of collectors, arranged in at least one row. The modular solar system further includes an energy-receiving-module, having a receiver unit, adapted to absorb the solar energy, a shaft, a support structure, a stand, disposed on rigid surface, a control-subsystem, a motor and a sun-following mechanism coupled to operate with the control-subsystem. The receiver unit has a diameter $d_r$, wherein collected energy directed at the external surface of the receiver unit forms a pair of solar energy strips, each strip having a width $d_e$, such that $d_e < d_r$. The solar system may be shipped by land vehicles inside one standard container, wherein each major component is light weight, and can be lifted by two workers.

26 Claims, 34 Drawing Sheets

Related U.S. Application Data

PCT/IL2012/050478, filed on Dec. 3, 2012.

(60) Provisional application No. 61/036,086, filed on Mar. 13, 2008, provisional application No. 61/566,608, filed on Dec. 3, 2011.

(51) Int. Cl.

| | |
|---|---|
| *F24J 2/38* | (2014.01) |
| *H01L 31/0525* | (2014.01) |
| *F24J 2/05* | (2006.01) |
| *F24J 2/07* | (2006.01) |
| *F24J 2/10* | (2006.01) |
| *F24J 2/14* | (2006.01) |
| *F24J 2/51* | (2006.01) |
| *F24J 2/52* | (2006.01) |
| *F24J 2/54* | (2006.01) |
| *H02S 40/44* | (2014.01) |
| *H01L 31/054* | (2014.01) |
| *F24J 2/46* | (2006.01) |

(52) U.S. Cl.
CPC .... *F24J 2/12* (2013.01); *F24J 2/14* (2013.01); *F24J 2/24* (2013.01); *F24J 2/38* (2013.01); *F24J 2/51* (2013.01); *F24J 2/5233* (2013.01); *F24J 2/541* (2013.01); *H01L 31/0547* (2014.12); *H02S 40/44* (2014.12); *F24J 2002/108* (2013.01); *F24J 2002/4669* (2013.01); *Y02E 10/41* (2013.01); *Y02E 10/44* (2013.01); *Y02E 10/45* (2013.01); *Y02E 10/47* (2013.01); *Y02E 10/52* (2013.01); *Y02E 10/60* (2013.01); *Y10T 29/49355* (2015.01)

(56) References Cited

U.S. PATENT DOCUMENTS

| | | | |
|---|---|---|---|
| 4,281,614 A * | 8/1981 | McNary | B63B 27/36 114/230.13 |
| 4,644,934 A * | 2/1987 | Kaus | F24D 17/0021 126/605 |
| 5,737,780 A | 4/1998 | Okita et al. | |
| 5,809,583 A | 9/1998 | Pucciani | |
| 6,385,797 B1 | 5/2002 | Phillips | |
| 6,606,988 B2 * | 8/2003 | Clark | F24J 2/02 126/682 |
| 6,754,917 B1 | 6/2004 | Rhoades | |
| 2008/0038107 A1 | 2/2008 | Henshaw et al. | |
| 2011/0073104 A1 * | 3/2011 | Dopp | F24J 2/055 126/651 |
| 2011/0132457 A1 * | 6/2011 | Finot | F24J 2/07 136/259 |
| 2011/0162692 A1 * | 7/2011 | Giacalone | F24J 2/542 136/248 |

OTHER PUBLICATIONS

Final Office Action issued for related U.S. Appl. No. 13/988,324 dated Jun. 5, 2014.

* cited by examiner

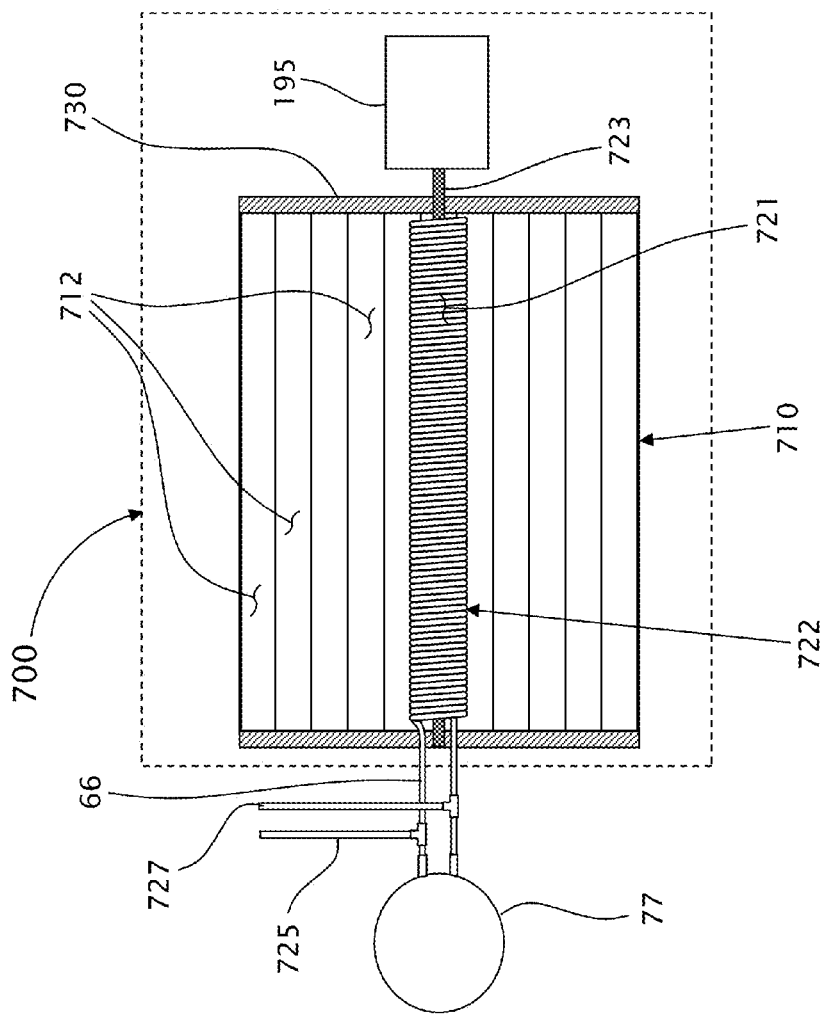
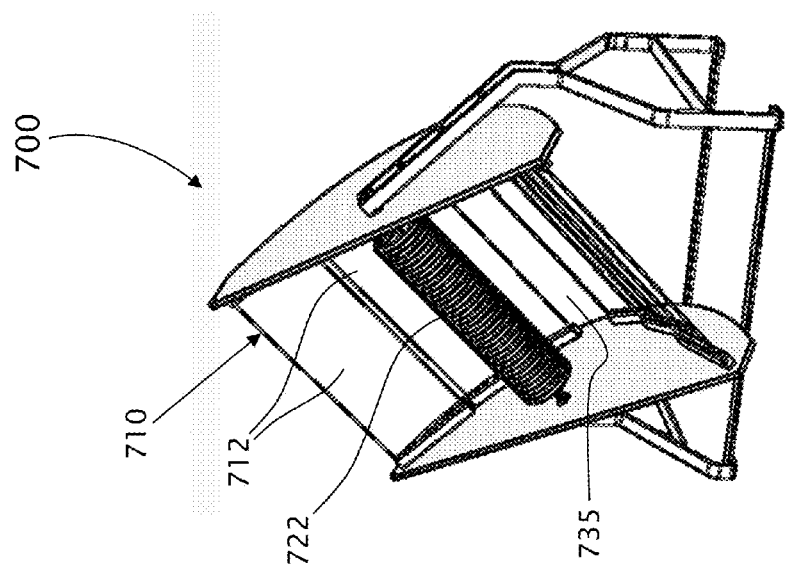
Fig. 1b
Fig. 1a

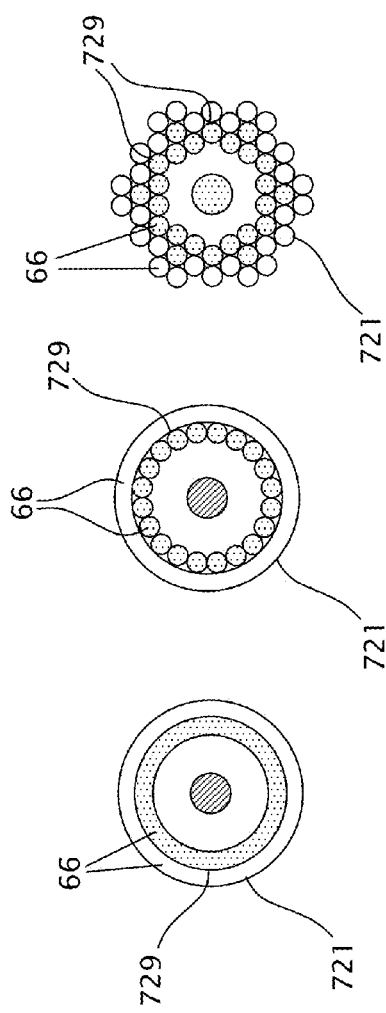
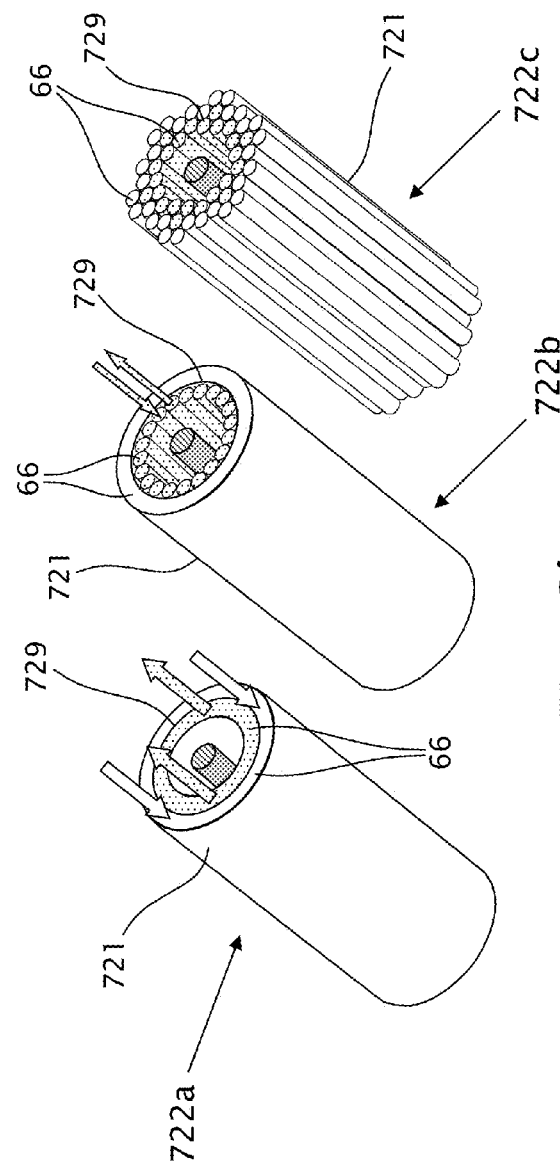
Fig. 6a
Fig. 6b

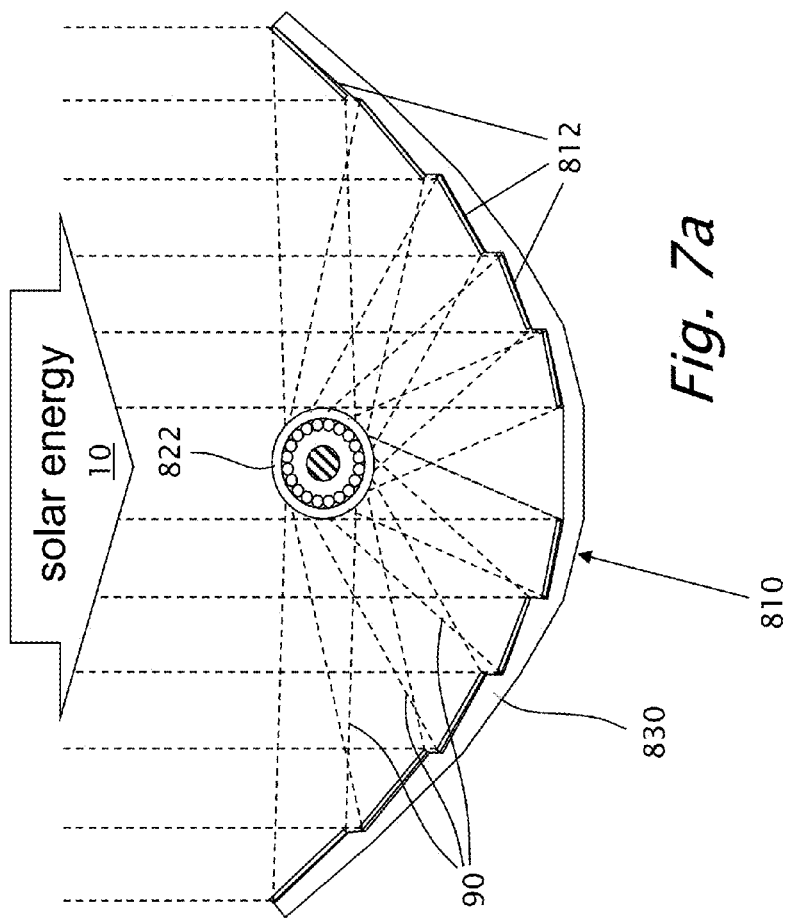
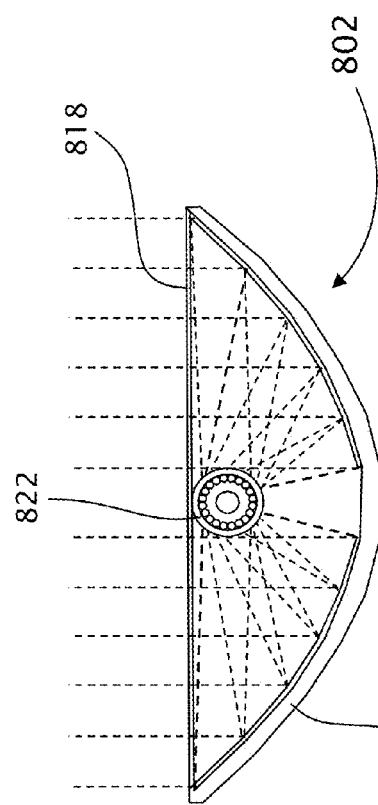
Fig. 7a
Fig. 7b

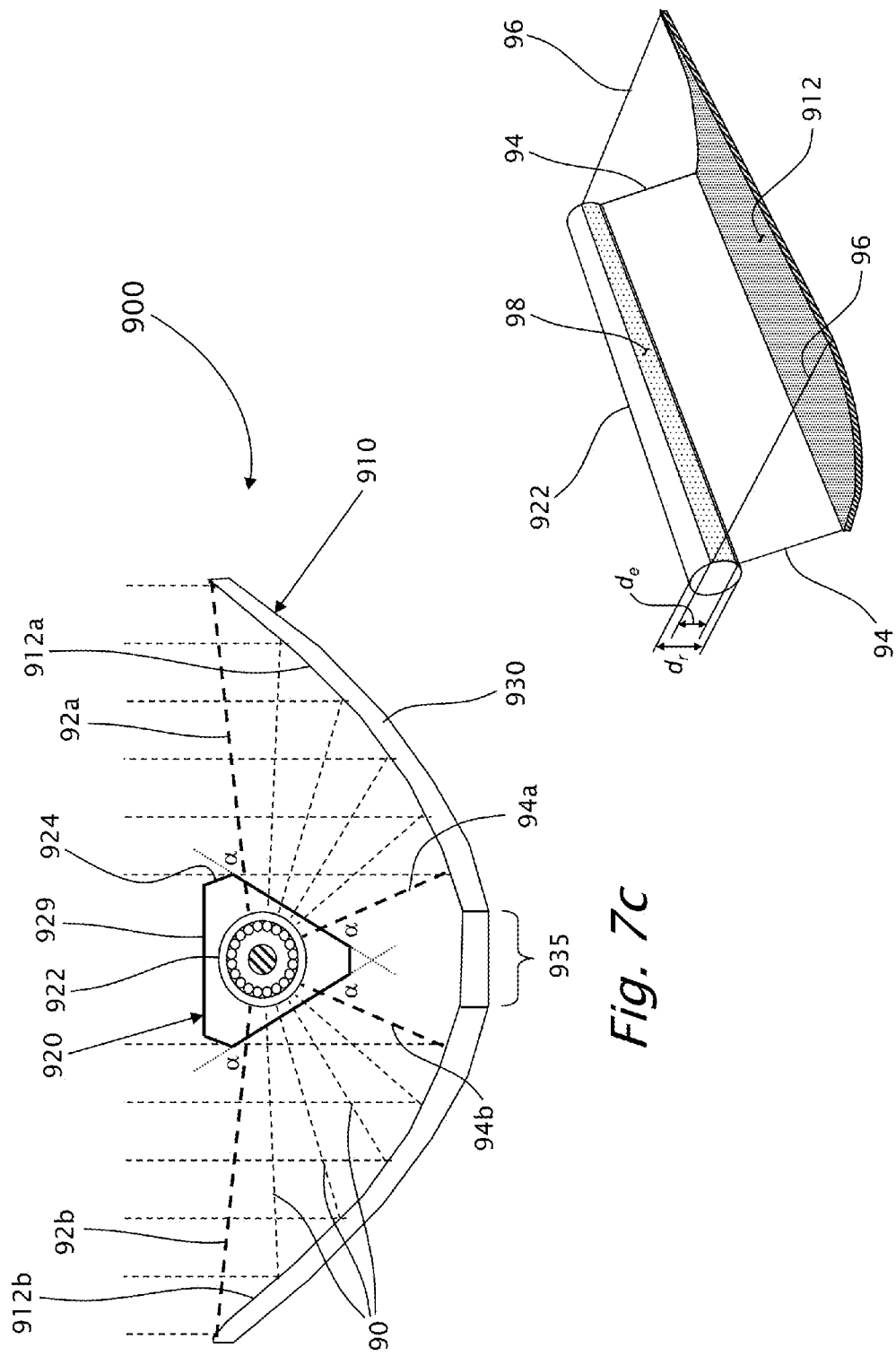

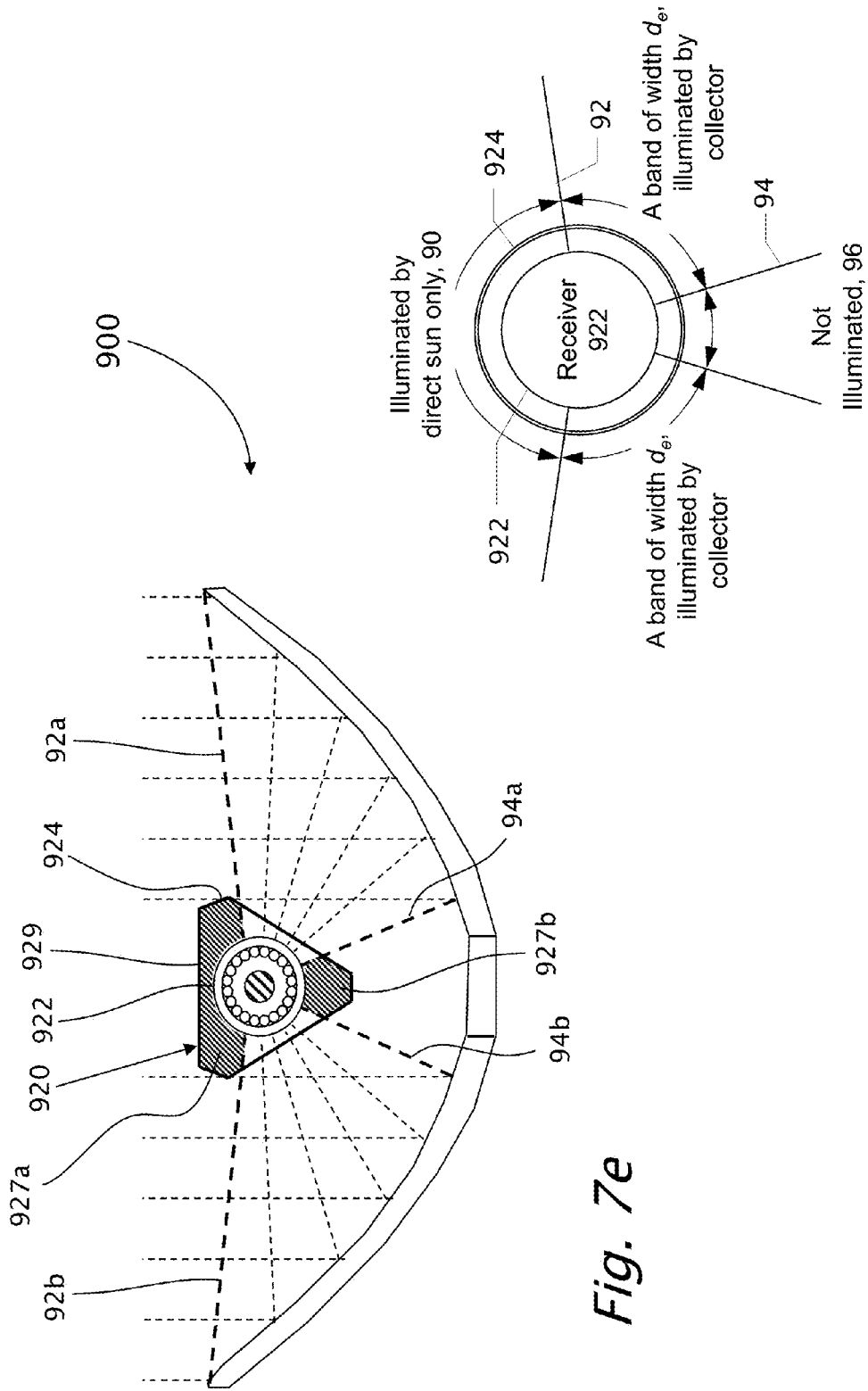

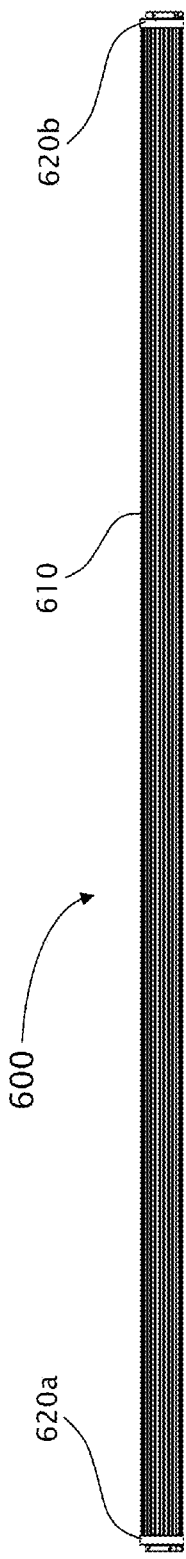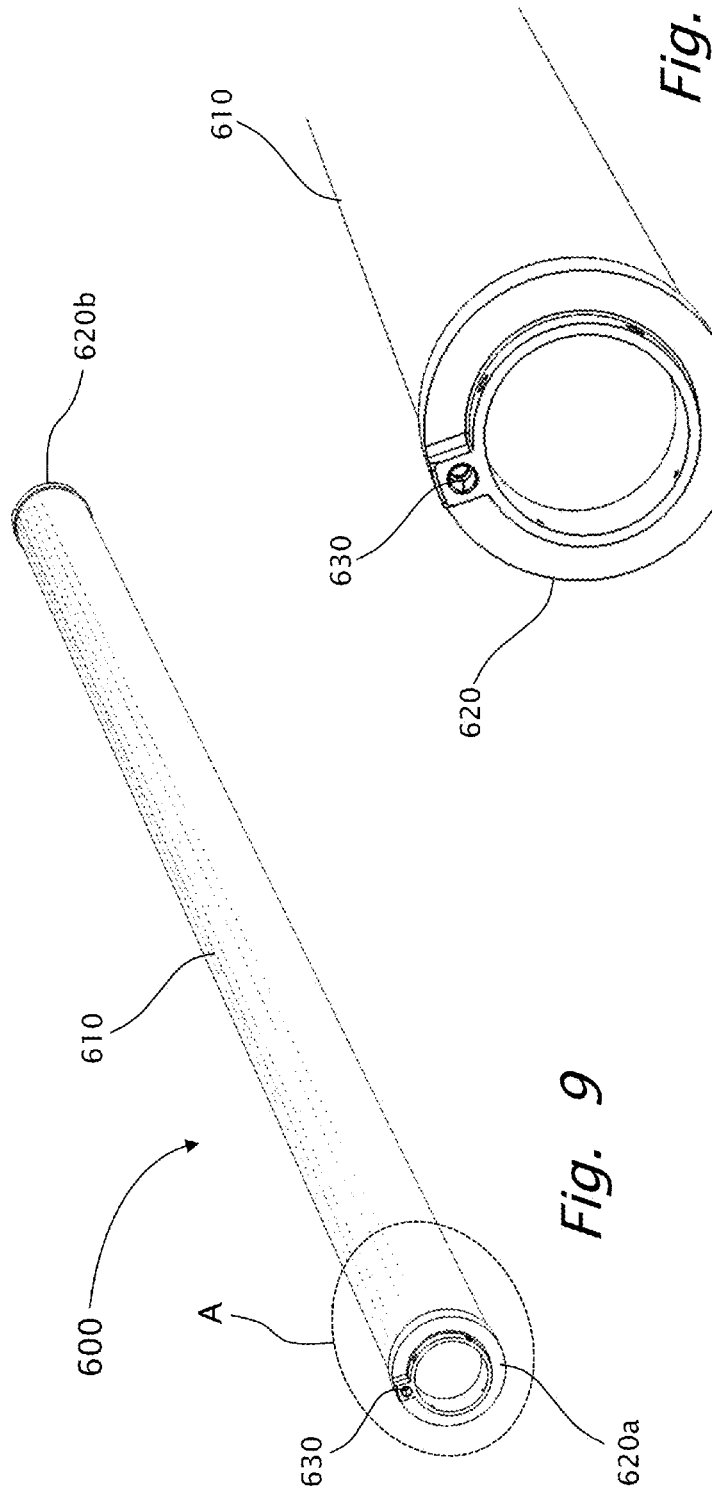

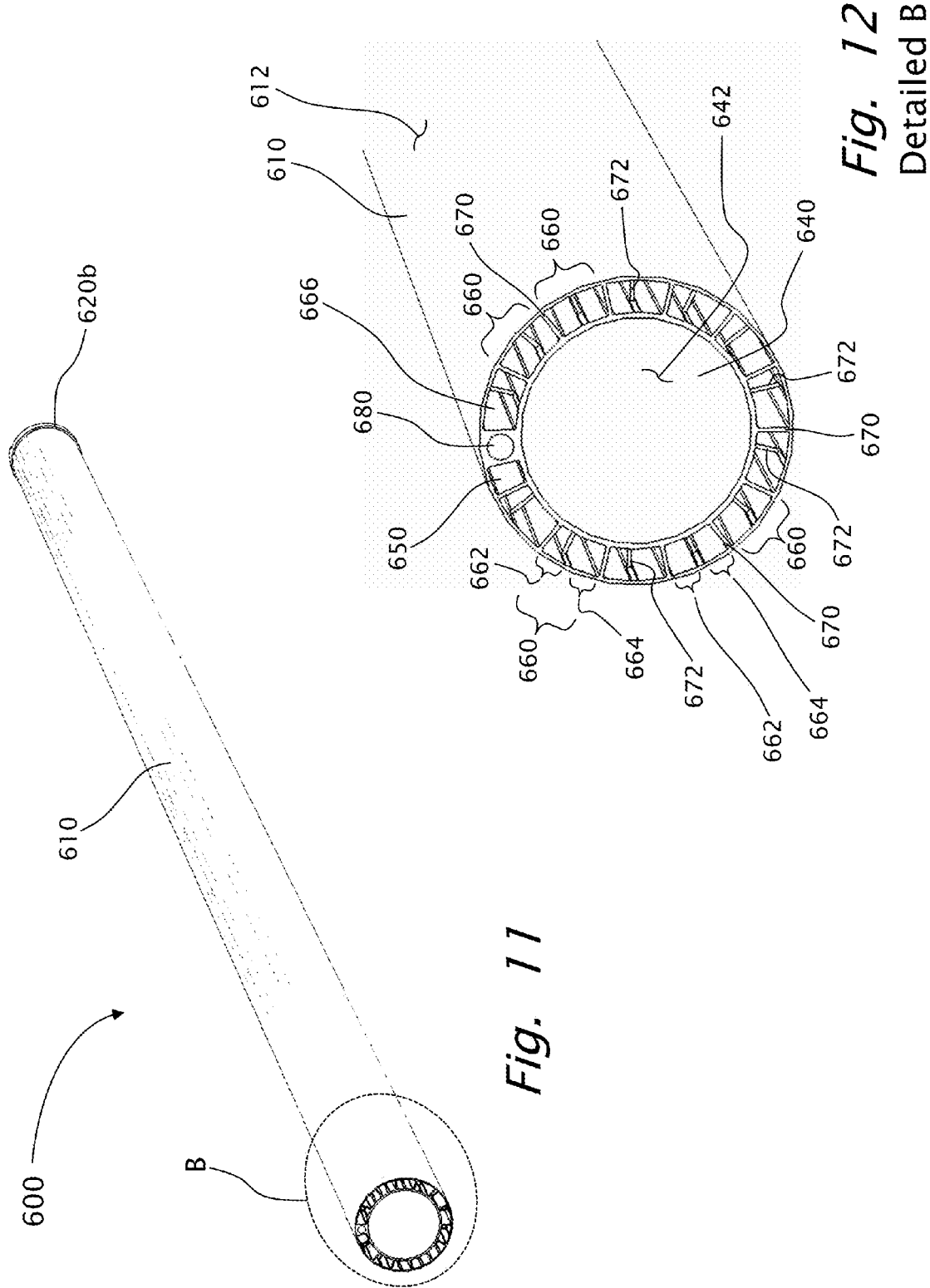

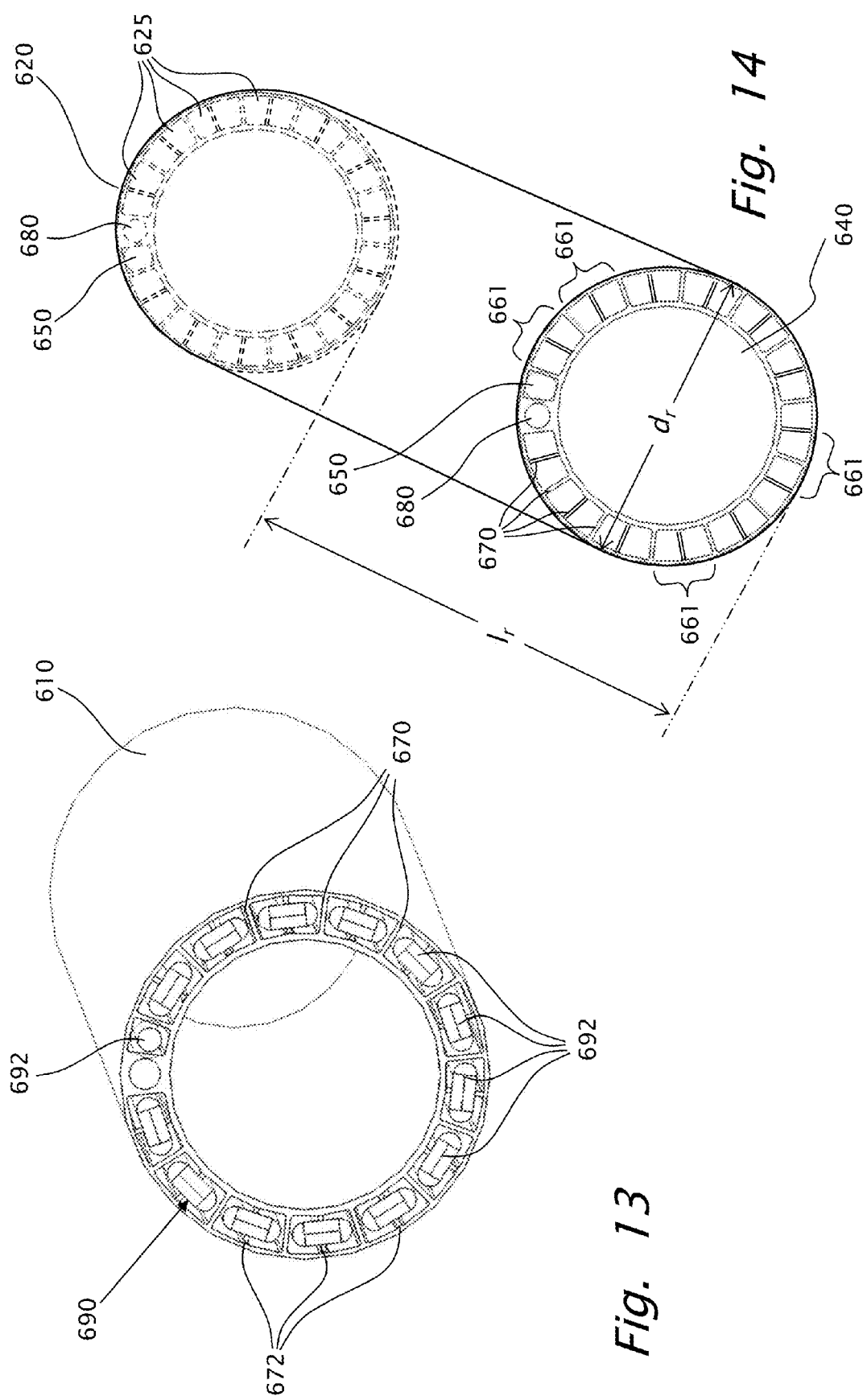

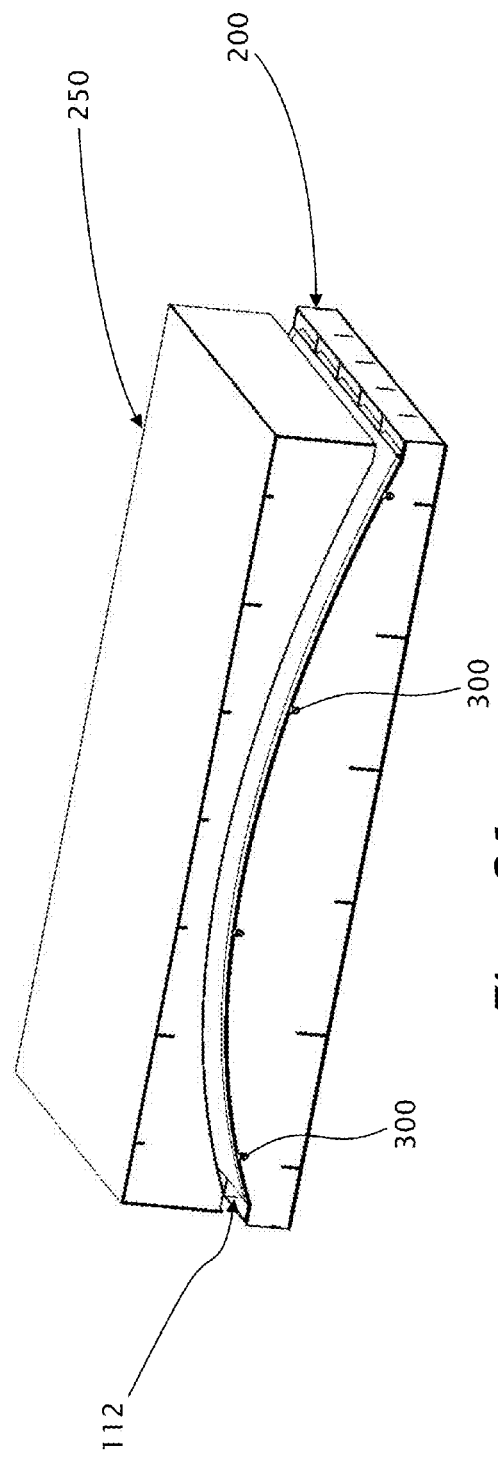
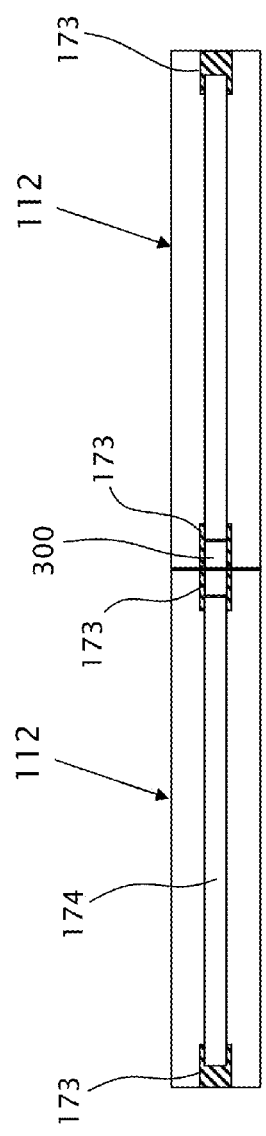
Fig. 21
Fig. 22a

MODULAR SOLAR SYSTEMS FACILITATING RAPID ASSEMBLY

CROSS REFERENCE TO RELATED APPLICATION

This application is a continuation in part of U.S. patent application Ser. No. 12/921,255, filed on Sep. 7, 2010, which is a national stage entry of PCT/IL2009/000283, which claims the benefit of U.S. Provisional Patent Application No. 61/036,086 filed Mar. 13, 2008, and of PCT application PCT/IL2012/050478, filed on Dec. 3, 2012, which claims the benefit of U.S. Provisional Patent Application No. 61/566,608 filed Dec. 3, 2011, the disclosure of all of which is incorporated by reference for all purposes as if fully set forth herein.

FIELD OF THE INVENTION

The present invention generally relates to solar systems, in which systems solar energy is concentrated for purposes of generating heat or power. More particularly, the present invention relates to a system for providing hot water by concentrating solar energy.

The present invention further relates to methods for providing solar energy with high efficiency, performance-wise and cost-wise.

The present invention further relates to a modular solar system for providing concentrated solar energy to act as an energy source, wherein the modular solar system can be assembled within hours, on location in the field, from pre-made portable units.

BACKGROUND OF THE INVENTION AND PRIOR ART

Current systems include flat plate solar panels, common in solar water heating, evacuated tube solar collectors, also used for hot water and other uses, and parabolic trough collectors. Less common are circular parabolic collectors. The parabolic collectors are examples of concentrating designs as are the large scale systems where a large number of flat mirrors reflect solar energy to a tower for purposes of generating steam for power generation. Each of these systems has limitations.

Flat panel solar collectors, such as those used in domestic hot water heating systems, make use of greenhouse effect to heat up an enclosed box with a transparent cover exposed to the sun. Both direct and indirect energy are collected. Limitations of these flat panel collectors include the fact that these panels are typically stationary and at hours of the day where the sun is not directly overhead are receiving only a fraction of the energy they could receive because of the oblique angle of the sun with respect to the panel normal. That is, the flat panels do not follow the sun to get the full exposure possible. Generally this represents a loss of up to 20-30% on a typical day. Overall, flat panel efficiencies typically vary from 40-60%. It is possible for a flat panel system to be designed to follow the sun, but the cost would be relatively high. Typically, flat panel collectors heat up the working fluid to around 70-80° C.

Parabolic trough collectors concentrate solar energy to a receiver tube oriented at the focal point of the parabola. Typically, these systems have been used for large energy producing facilities and use rather high concentration ratios in order to raise the temperatures to several hundred degrees. At such high temperatures, there are losses due to conduction, convection, and radiation. Surrounding the receiver with a glass tube virtually eliminates convection losses leaving losses only due to conduction and radiation, with the latter being larger at the higher range of temperatures. Since the losses are proportional to the exposed area, the receiver tubes are made small. As a consequence, the tracking accuracy must be quite high and, since the structures are large for the power required, such systems must also have a structure that can withstand distortions due to wind loading. Both the tracking and the structure contribute greatly to a higher cost. Apart from these, another factor reducing the overall efficiency of prior art parabolic trough collectors is the inability to absorb indirect radiation unlike the flat panel and evacuated tube collectors.

Efficient use of solar energy has been a goal for as long as using solar energy has been around. The temperature of fluid leaving the receiver is the usual variable and is adjusted using flow rate of the fluid. But the level of heating is dependent on the efficiency of the heat transfer. By increasing the flow rate on a given geometry, the efficiency also changes. One can flow so fast that it does not absorb enough energy. Or it can flow so slowly that the fluid begins to radiate away much of the previously absorbed heat. The efficiency versus speed is thus a peaked function with excess losses at each end.

Prior art parabolic trough concentrating solar systems attempt to minimize radiation energy loss by making the diameter of the receiver as small as possible. However, this causes several problems, including increasing the requirement of the coupled solar tracking sub-system to avoid thermal cycling losses.

It is the intention of this disclosure to present a highly efficient solar collector that is scalable from residential use to larger commercial enterprises, and can be used with the same high efficiency for virtually any of several purposes for which solar energy is to provide power. These purposes are primarily residential or commercial hot water heating including manufacturing processes that use hot water, low pressure steam, power generation, air conditioning, and space heating.

It is a further intention of this disclosure to provide a system which is inexpensive in construction, in the choice of materials, labor cost, shipping cost, maintenance cost and lifetime costs. No currently existing solar collector can provide the consistently high efficiency of the disclosed system across such a spectrum and maintain a low cost. But by combining several existing concepts, however, such a system can be devised.

Efficiency is defined in several ways, but for purposes of this disclosure, solar power efficiency is defined as the fraction of solar power utilized from the solar power directly available, per unit area. It is also desirable for the solar collector to occupy the smallest space possible so that roof tops of apartment buildings, for example, may be able to sustain a large number of collectors for all the apartments building.

Not included in the efficiency calculation is the extra solar radiation available indirectly. This energy comes from radiation scattered by the atmosphere and that reflected off of nearby surfaces such as buildings, walls, bodies of water, and so forth. This energy normally amounts to another 20-30% of the energy available directly from the sun. It is a goal of the present system to be able to absorb some of this energy as well.

What is needed is a modular solar system, facilitated to collect a substantial portion of the direct and indirect solar energy incident on the area occupied by the collector and use it to either generate electricity, or heat working fluid, or both. It would be advantageous to have a medium size or large modular solar system that fit on standard containers and can thereby be transported to the operation field location in separate modules, and that can be assembled on site within a few hours.

DEFINITIONS

The terms 'tubing' or 'piping' relates hereinafter in a non-limiting manner to any conduit through which a liquid or gas can flow without referring to the type of material (though if high heat is involved we generally mean metal or some other heat-capable material) and, as is common in the art, a pipe generally refers to a nonflexible conduit and a tube means flexible.

The term 'collector' relates hereinafter in a non-limiting manner to the generally parabolic shaped reflecting surface, which reflecting surface incident solar radiation first impacts. It is the purpose of the collector to collect incident solar energy from the area it occupies and reflect it to a "receiver" defined below.

The terms 'receiver' or 'receiver unit' relate hereinafter in a non-limiting manner to the device, having an external surface, and which external surface receives the incident solar energy from the collector. The receiver is also responsible for transferring the received energy to the working fluid flowing within.

The term 'working fluid' refers to any liquid or gas which absorbs the energy received by the receiver unit. If the fluid is a liquid, it may be advantageous for it to be converted to its gas phase with an attendant expansion which may be useful for driving a piston. Such is common in solar powered steam generators. The working fluid could be water as in the case of some residential solar hot water systems. In colder climates when exposed pipes can freeze if they contain water, it is more typical to use a working fluid with a very low freezing point and higher boiling point.

The term 'solar-tracking' is used interchangeably with 'sun-following' and refers to any method or mechanism aimed to keep a constant angle with respect to the position of the sun. Specifically, here, it means keeping the angle of the short dimension of the reflecting surfaces at a constant angle to the sun.

The system is designed, in some embodiments of the present invention, to receive incident solar energy, concentrate it on a receiver's surface and then use the concentrated energy to heat a working fluid which is then used for a number of possible applications.

The term "greenhouse effect" will refer to the phenomena, common in greenhouses, that incident solar energy on a glass enclosure passes through the glass which has high transmissivity at the frequencies of the solar spectrum, but much lower transmissivity to the radiation spectrum of the heated materials within the greenhouse. This phenomenon is responsible for the warmer temperatures within the greenhouse than outside, as well as in a number of other systems, like automobiles parked in the sun, and houses whose windows face the sun without blinds or other window treatment to block the radiation.

SUMMARY OF THE INVENTION

The principal intentions of the present invention include proving a system for concentrating solar radiation for the purpose of providing heat and power. It is another intention of the present invention to disclose the avoidance of energy loss due to reflections from a low incidence angle of the energy on the receiver. One unappreciated problem of concentrating solar energy is the reflection of incoming energy off of the receiver element. Generally, the receiver element is round as in tubing or piping and the incoming energy is incident to the normal of the tube axis. As such, it encounters a range of incidence angles with respect to the receiver surface. When the incidence angle is low enough, the surface acts as a reflector rather than an absorber and the incident radiation is lost. These same phenomena cause mirages. On the other hand, if the energy is concentrated in too small an area on the receiver, it will heat up giving a large temperature and large temperature gradient, which then loses heat by radiation, convection, and conduction to the surroundings. Hence, it is advantageous for the collector to spread the radiation over only a portion of the receiver surface without over-concentrating it in one spot. A parabolic reflector, whose focus is along the axis of a receiver, is an appropriate candidate since every segment of the reflector places its energy on a different spot of the receiver and whose incidence is normal.

The principal intentions of the present invention further include providing a modular solar system, facilitated to collect a substantial portion of the direct and indirect solar energy incident on the area occupied by the collector and use it to either generate electricity, or heat working fluid, or both. A medium size system or a large modular solar system can be transported on land to an operation-field-location in separate modules, sized to fit on standard containers. Each individual module of the modular solar system and can be assembled on site within a working day by two persons.

The principal intentions of the present invention further include providing a rapid assembly method. For example, the assembly of the main frame of a large unit ($27\,m^2$) can be done in 2-3 hours by two workers. The remaining construction and check-out is typically done within 2-3 additional hours. Hence, several modular solar systems, according to the present invention, a can be constructed within one day.

The principal intentions of the present invention further include providing a modular solar system having portable components, to thereby facilitate on site assembly and possibly, partial manufacturing. Components are designed with minimal internal space. Components are light weight and can be lifted by two workers.

A large number of modular solar system units may be shipped inside one standard container, wherein the number of units depends on the size of a single modular solar system unit, in particular the number of the individual-collectors in a collector-assembly. Each major component is pre-made and thereby, the modular solar system of the present invention can be assembled in the field, on location. Alternatively, the individual-collectors may be manufactured on site.

The principal intentions of the present invention further include providing a low-cost modular solar system. Each component is designed from standard and low cost materials. No exotic or specialty materials are required, except for the Mylar reflective material. Construction is designed to be rapid with minimum personnel to lower construction cost.

According to the teachings of the present invention there is provided a solar heating system for collecting solar energy, including a parabolic trough-type solar energy collector-assembly, including two wings, each having at least one parabolic collector. Each collector includes a rigid body and a mirror-grade polished metal sheet or mirror-grade surface operatively facing the sun.

The solar heating system further includes an energy-receiving-module, adapted to absorb the solar energy and an elongated, substantially transparent, receiver-housing.

The energy-receiving-module includes a receiver unit having a body with a preconfigured diameter ($d_r$) and length ($l_r$), wherein a series of working fluid flow passages allow selected working fluid to travel back and forth within the receiver unit, wherein the flow passages are arrayed around the axis of rotation and may be oriented in a circular geometry, proximal to the external surface of the receiver unit. Preferably, the receiver unit is disposed at the center of gravity of the pivotal collector-assembly. The working fluid may be water, gas or any other suitable fluid.

The elongated receiver-housing, includes a generally triangular prism shape, wherein a first face of the receiver-housing faces away from the wings, and each of the second and third faces of the receiver-housing face respectively at least one parabolic collector, having substantially the same length as the receiver unit.

The solar heating system further includes a shaft, a support structure including a stand to be disposed on a substantially rigid surface, a control-subsystem, a modulated flow temperature controlled pump, a rotating mechanism and a sun-following mechanism coupled to operate with the control-subsystem.

The at least one parabolic collector collect the solar energy from the sun and the collected energy is directed at the external surface of the receiver unit, as indicated by the sun-following mechanism. The collected energy that is directed at the external surface of the receiver unit forms a pair of solar energy strips along the external surface of the receiver unit, each strip having a width $d_e$, wherein $d_e < d_r$, to thereby allow a relaxed solar tracking error.

In the preferred embodiments, the receiver unit has a generally circular lateral cross section. As such, the shaft is a stationary shaft. The collector-assembly is securely attached to the support structure that is pivotally attached to the stationary shaft. The control-subsystem is adapted to activate the rotating mechanism in order to pivotally position the collector-assembly, with respect to the stationary shaft, such that the collectors face the sun during daylight hours. The collected energy is directed at the external surface of the receiver unit, as indicated by the sun-following mechanism.

I some embodiments said receiver unit has a generally non-circular lateral cross section, wherein the shaft is a rotating shaft that is securely attached to the support structure. The receiver unit and the collector-assembly are also securely attached to the support structure. The control-subsystem is adapted to activate the rotating mechanism to pivot the rotating shaft, in order to position the collector-assembly, along with the generally non-circular receiver unit, with respect to the horizon, such that the collectors face the sun during daylight hours, and the collected energy is directed at the external surface of the receiver unit, as indicated by the sun-following mechanism.

The invention will be described herein in terms of the receiver unit having a generally circular lateral cross section, as in the preferred embodiments.

Preferably, the system is a modular system adapted to be assembled on-site, and wherein the at least one parabolic collector is assembled from a number of substantially identical individual-collectors, arranged in at least one row. Each individual-collector includes a rigid body and a mirror-grade polished metal sheet operatively facing the sun. Each of the individual-collectors further includes at least one laterally disposed threading-tube, integrated into the rigid body, and wherein the solar collector-assembly further includes at least one tie-rod.

Each of the lateral threading-tubes forms an elongated-open-tube or profile, when the individual-collectors are arranged in a row, wherein each of the tie-rods is inserted through a respective elongated-open-tube and is tightly secured to the support structure.

The solar heating system further includes a braking subsystem configured to lock the pivotal motion of the support structure about the stationary shaft, when the sun-following mechanism is not in operation.

The mirror-grade polished metal sheet is burnished to yield a mirror-grade polished surface, or is coated with of highly reflective film having a mirror-grade polished surface.

The support structure includes a pivotal-mechanism, such as bearings, adapted to allow pivotal motion of the support structure about the stationary shaft, and wherein the control-subsystem is adapted to activate the rotating mechanism in order to pivotally position the collector-assembly, with respect to the stationary shaft. Multiple solar heating systems can be connected axially together and driven by the single sun-following mechanism the single control-subsystem.

The relaxed solar tracking error facilitates intermittent solar tracking, wherein the control-subsystem is activates the rotating mechanism in order to pivotally position the collector-assembly, with respect to the stationary shaft, according to the accumulated tracking error, at a selected time interval, selected such that the solar energy strips remain within the diameter boundary of the receiver unit.

Optionally, the collector-assembly is enclosed by a highly transparent, substantially flat cover.

Preferably, a gap is formed between the two wings.

Preferably, the solar energy reflected from each of the collector units form a beam having an upper boundary beam, coming from the top of the collector unit, and a lower boundary beam, coming from the bottom of the collector unit, and wherein the second and third faces of the prism shaped receiver-housing form substantially the same angle ($\alpha$) with the upper and lower boundary beams.

Preferably, the prism shaped receiver-housing is securely attached to the support structure and thereby pivots along with the collector-assembly, while the receiver unit remains stationary.

Preferably, the faces of the prism shaped receiver-housing are enclosed by substantially transparent materials, such as glass. Optionally, heat insulation material is disposed between the first face of the prism shaped receiver-housing and the receiver unit, wherein the insulation may include a foil surface nearest to the receiver unit.

Optionally, heat insulation material is disposed between faces of the prism shaped receiver-housing and non-illuminated regions of the receiver unit, such as the bottom region of the receiver unit.

Optionally, PV panels are securely attached onto the external surface of the first face of the prism shaped receiver-housing. PV panels may also be securely attached onto the external surface of the other two faces of the prism shaped receiver-housing.

The receiver unit is securely mounted onto, or is part of, the stationary shaft, wherein the stationary shaft is adapted to facilitate the working fluid to flow in and out of the receiver unit. The control-subsystem is adapted to control the flow rate of the selected working fluid within the receiver unit, typically by using a modulated flow temperature controlled pump, to thereby keep the temperature of the selected working fluid within a predetermined range.

Optionally, the receiver includes an extruded body having an external surface and two open ends, wherein the two open ends are sealingly enclosed by a pair of fitted caps. The extruded body is a pipe having an inner space formed by an inner surface, wherein the extruded body includes a multiplicity of passageways separated by internal walls disposed longitudinally between the two open ends.

The passageways are interconnected to form a single elongated-passageway having one flow-inlet and one flow-outlet being in flow communication with fitted openings formed in the caps. The passageways may be arranged in pairs, wherein each pair of the passageways is bounded by sealed walls and wherein the pair of passageways is separated by a nibbled-wall, facilitating flow of fluid between the passageways of the pair of passageways. An internal wall, that is a sealed wall at one of the open ends of the extruded body, is a nibbled wall at the other open end of the extruded body, to thereby form the single elongated-passageway, when enclosed by the caps. The cups may be substantially identical.

Inner-pipes may be inserted through the passageways, wherein the inner-pipes are interconnected and sealed by a connecting member disposed in the space formed at the nibbled-wall to thereby form a single elongated pipe, having a first end passing through the flow-inlet and connected to the fitted opening formed in a first of the caps, and second end passing through the flow-outlet and connected to the fitted opening formed in the second of the caps.

The caps may include pairing members, integrated therein, and wherein each of the pairing members is adapted to sealingly enclose preconfigured pairs of the passageways, facilitating flow of fluid between the passageways of the pair of passageways, when enclosed by the caps. The pairing members of a respective one of the caps, is configured to enclose non-overlapping adjacent pairs of the passageways, with respect to the pairing members of the other of the caps, to thereby form the single elongated-passageway.

The extruded body may further include an alignment hollow cavity, formed at the open ends facilitating fast and error-free enclosure of the pair of caps.

The energy-receiving-module may further include a flat, substantially reflective end-reflector having a reflective surface and disposed at a preconfigure end of the collector-assembly, wherein the end-reflector is protruding generally towards the sun; the reflective surface faces the reflective surface of the respective collector; and when at lower sun angles, some of the suds rays reflected back from the reflective end-surface to the receiver unit.

The individual-collectors may be fabricated by molding from materials selected from the group including polymers and fiberglass.

The frame-assembly of the modular system is designed to be assembled, with no limitation, by no more than two people, wherein simple, portable and preferably foldable cranes assist with construction. The frame-assembly includes two, substantially upright stands, two collectors' side holders, collectors' tightening rods, and preferably, an energy-receiving-module supporting structures.

The main frame profiles of the frame-assembly are made of rigid materials, such as steel, for stiffness. Typically, most of the components of the frame-assembly are assembled with bolts and lock washers, and typically, with no welding.

Preferably, each of the individual-collector further includes at least one laterally disposed threading-tube, integrated into the rigid body, and wherein the solar collector-assembly further includes at least one tie-rod. Each of the lateral threading-tubes forms an elongated-open-tube, when the individual-collectors are arranged in a row, wherein each of the tie-rods is inserted through a respective elongated-open-tube and is tightly secured to the support structure. The collectors are very light in weight but are also very stiff to avoid optical distortion.

The mirror-grade polished metal sheet may be burnished to yield a mirror-grade polished surface.

Alternatively, the mirror-grade polished metal sheet may be coated with of highly reflective film, such as Mylar reflective film, having a mirror-grade polished surface. Each individual-collector of the collector-assembly is fabricated by a mold to thereby guarantee a specific contour of the collector. The mold is made of rigid materials, such as steel, to ensure stiffness. The mold is preferably made from fool-proof parts to prevent miss-assembly. Each individual-collector is constructed of lightweight sheet-metals coated with reflective materials such as Mylar reflective film ("Mylar"), having high reflective properties. Mylar is lightweight and is Mylar is typically applied onto a sheet-metal with rollers. Stiffness is provided to an individual-collector by either using fiberglass for the sheet-metal frame, or by a foam-filled sheet-metal box. Alternatively, the sheet-metal are not coated but burnished to yield a mirror-grade polished surface. The burnished mirror-grade polished metal sheet is made of aluminum, stainless steel or any other metal sheet.

An aspect of the present invention is to provide a method for assembling the modular solar system, adapted for shipping by land vehicles, when unassembled. The method includes the steps of providing the unassembled modular solar system, providing at least a one cranes and preferably two, each adapted for shipping by land vehicles, and erecting the crane. Preferably the cranes are in folded form to facilitate fast erection.

The method further includes the steps of hanging energy-receiving-module onto the cranes; assembling the support structure; mounting the individual-collectors of each of the collector-assembly onto a preconfigured section of the frame assembly; securing the individual-collectors of each of the collector-assembly to the frame assembly; mounting the stands onto the shaft securely attaching thereto, the shaft being typically stationary; and disposing the stand onto a rigid surface typically a substantially planner surface.

It should be noted that each member of the modular solar system is designed such that the member can be lifted by two persons.

Preferably, each of the individual-collector further includes at least one laterally disposed threading-tube, integrated into the rigid body, and the solar collector-assembly further includes at least one tie-rod. Each of the lateral threading-tubes forms an elongated-open-tube, in the mounting step of the individual-collectors of each of the collector-assembly onto the support structure. The step of securing the individual-collectors to the support structure includes inserting the tie-rods through respective elongated-open-tubes and tightly securing the tie-rods to the support structure.

An aspect of the present invention is to provide a method of manufacturing a solar energy collector, having a reflective surface, including the step of providing a mold having a base part with a shaping surface, and a pressing top part with a pressing surface, wherein the shaping surface has a convex curvature having a preconfigured arc, preferably a generally parabolic arc, aimed to form the curvature arc of the solar energy collector; and wherein the pressing surface has a preconfigured curvature.

The method further includes the step of forming a collector-frame having two straight-side walls and two curved-side walls, with curvatures that match the respective curvatures of the shaping surface and the pressing surface.

The method further includes the steps of placing a reflective sheet on the shaping surface, having preconfigured dimensions of the reflective surface the solar energy collector; placing the collector-frame on top of the reflective sheet; placing spacers, having preconfigured height, the set the thickness of the solar energy collector being manufactured;

filing the inner space of frame with foam of a preconfigured material; placing a back-cover-sheet, having preconfigured dimensions, on top of the collector-frame; placing the pressing top part of the mold on top of the back-cover-sheet; and waiting until the foam cools down and hardens.

Preferably, the pressing surface of the pressing part is concave.

Preferably, the method further includes the step of providing a mold as in claim 29, wherein the base part further includes raised-side-walls adapted to accommodate the side walls of the collector-frame, wherein the raised-side-walls have a height that is at least half the height of the side walls of the collector-frame and less than the full height of the side walls of the collector-frame, and wherein niches) are formed in the raised-side-walls, at preconfigured locations, extending down to a preconfigured height. This is to ensure alignments between adjacent individual collectors, when being assembled.

The method further includes the steps of placing threading-tube inside the collector-frame, wherein the threading-tube are held in position by spacer-nipples, inserted through respective, fitted apertures formed in the side walls of the collector-frame; and when placing the collector-frame on top of the reflective sheet, placing the spacer-nipples into the niches, formed in the raised-side-walls.

BRIEF DESCRIPTION OF THE DRAWINGS

The present invention will become fully understood from the detailed description given herein below and the accompanying drawings, which are given by way of illustration and example only and thus not limitative of the present invention, and wherein:

FIG. 1a is a perspective non-dimensionally scaled view illustration of a concentrated solar heating system for collecting solar energy, according to some embodiments of the present invention.

FIG. 1b is a non-dimensionally scaled, partially sectioned, top view illustration of the concentrated solar heating system shown in FIG. 1a.

FIG. 6a is a non-dimensionally scaled, side view illustration of a receiver unit of a concentrated solar heating system of the present invention.

FIG. 6b is a non-dimensionally scaled, bottom perspective view illustration of the receiver unit of the concentrated solar heating system of the present invention.

FIG. 7a is a non-dimensionally scaled, cross-sectional, side view illustration of a concentrated solar heating system for collecting solar energy, according to some embodiments of the present invention.

FIG. 7b is a non-dimensionally scaled, cross-sectional, side view illustration of the concentrated solar heating system shown in FIG. 7a, encased by a transparent enclosure.

FIG. 7c is a non-dimensionally scaled, cross-sectional, side view illustration of the concentrated solar heating system shown in FIG. 7a, wherein the receiver unit is encased by a generally triangular transparent enclosure.

FIG. 7d is a schematic illustration of the ray tracing of the solar energy reflected from the collectors to the receiver unit.

FIG. 7e is a non-dimensionally scaled, cross-sectional, side view illustration of the concentrated solar heating system shown in FIG. 7a, wherein the receiver unit is encased by a transparent enclosure, and selected external surfaces of receiver unit are insulated.

FIG. 7f is a schematic illustration of a concentrated solar heating system, wherein the receiver unit is encased by a transparent round enclosure.

FIG. 8 is a side view illustration of an extruded receiver unit, according to an embodiment of the present invention.

FIG. 9 is a perspective view illustration of the receiver unit shown in FIG. 8.

FIG. 10 is a detailed view of window A, as shown in FIG. 9.

FIG. 11 is a perspective view illustration of the receiver unit shown in FIG. 8, having one of the two caps removed, for illustrative purposes only.

FIG. 12 is a detailed view of window B, as shown in FIG. 11.

FIG. 13 is an isometric view illustration of the receiver unit shown in FIG. 8, having an inner elongated pipe, according to variations of the present invention.

FIG. 14 is an isometric view illustration of the receiver unit shown in FIG. 8, wherein the inner elongated pipe is formed by pairing members integrated in the enclosing caps, according to variations of the present invention.

FIG. 21 is an isometric view illustration of the individual-collector and the mold, as shown in FIG. 19, in a molding state.

FIG. 22a is a top/bottom-side, partially sectioned view of a pair of individual-collectors assembled together using fitted spacers, according to variations of the present invention.

DESCRIPTION OF THE PREFERRED EMBODIMENTS

Figure 2:
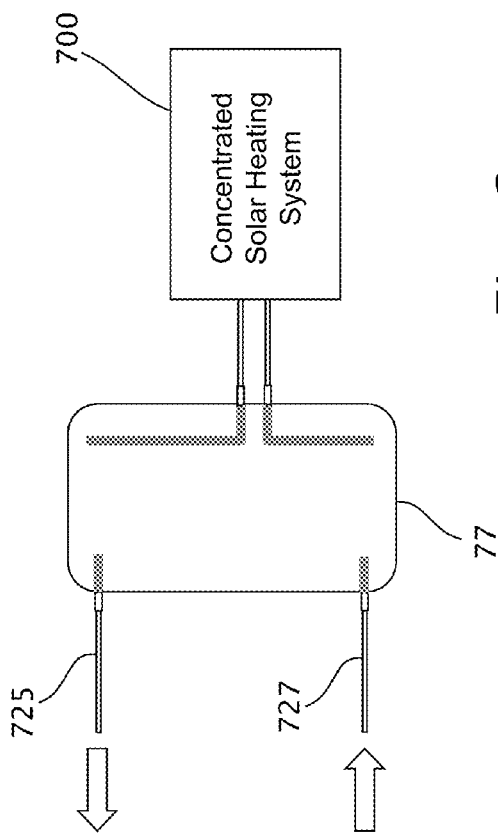
FIG. 2 is a non-dimensionally scaled, schematic diagram of an example solar hot water system according to an embodiment of the present invention.

Before explaining embodiments of the invention in detail, it is to be understood that the invention is not limited in its application to the details of construction and the arrangement of the components set forth in the host description or illustrated in the drawings. Various modifications, however, will remain apparent to those skilled in the art.

An embodiment is an example or implementation of the inventions. The various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment.

Methods of the present invention may be implemented by performing or completing manually, automatically, or a combination thereof, selected steps or tasks. The term "method" refers to manners, means, techniques and procedures for accomplishing a given task including, but not limited to, those manners, means, techniques and procedures either known to, or readily developed from known manners, means, techniques and procedures by practitioners of the art to which the invention belongs. The descriptions, examples, methods and materials presented in the claims and the specification are not to be construed as limiting but rather as illustrative only.

Meanings of technical and scientific terms used herein are to be commonly understood as to which the invention belongs, unless otherwise defined. The present invention can be implemented in the testing or practice with methods and materials equivalent or similar to those described herein.

It should be noted that orientation related descriptions such as "bottom", "up", "upper", "down", "lower", "top" and the like, assumes that the associated item is operationally situated.

Reference is now made to FIG. 1a, a perspective non-dimensionally scaled view illustration of a concentrated solar heating system 700 for collecting solar energy, according to some embodiments of the present invention. Reference is also made to FIG. 1b, a non-dimensionally scaled, partially sectioned, top view illustration of system 700 for concentrating solar energy, in order to attain high heat transfer rates and temperatures. A set of reflecting surfaces 712 are arranged on a frame 730 in such a way as to focus incident solar energy onto a receiver unit 722.

The reflecting surfaces 712 maintain orientation toward the sun using a sun-following mechanism 195 by pivoting frame 730 about a shaft 723. Sun following is well known in the art and many such systems exist based on clock drives, solar angle sensors, and so forth.

Working fluid 66 is operatively flowing inside receiver unit 722, and may have an inlet 725 where new fluid enters system 700, such as water in a hot water system as shown. The working fluid 66 may also have an outlet 727 where fluid 66 exits solar heating system 700 for use, for example in a hot water system. Preferably, a control-subsystem is adapted to control the flow rate of working fluid 66 within receiver unit 722, to thereby keep the temperature of working fluid 66 within a predetermined range. It should be noted that the internal frame surfaces may be painted or otherwise made a dark color to assist with the absorption of indirect radiation.

There are a large number of possible ways in which receiver unit 722 could be connected to a designated utility system 77 depending on the type of utility system (see, for example, U.S. Pat. No. 4,979,493). Some utility systems include thermostats to control the temperature of the water in the tank or other places in the system. Others may include a pump to circulate the working fluid 66 and or the water in a heat exchanger. Still others circulate the water using thermosyphon (natural convection) from the working fluid temperature gradient.

Reference is now made to FIGS. 2-5. The drawing does not necessarily reflect a useful one, but the manner in which the connections are made will be obvious to anyone skilled in the art. FIG. 2 which shows a non-dimensionally scaled schematic diagram of an example solar hot water system according to an embodiment of the present invention; generally, cold water enters the inlet 725 at the bottom of the hot water storage tank 77. This water is then drawn into solar heating system 700. Solar heating system 700 heats the water in solar receiver unit 722, which then is collected into a hot water storage tank 77. Hot water to be used is drawn from the outlet 727 top of the hot water tank. FIG. 2 simply shows the main idea and is not meant to be limiting. Some solar hot water systems use thermosyphoning to circulate the water in the system. Some use water pumps. Some use heat exchangers. Any configuration currently in use for solar hot water heating may be used here.

Figure 3:
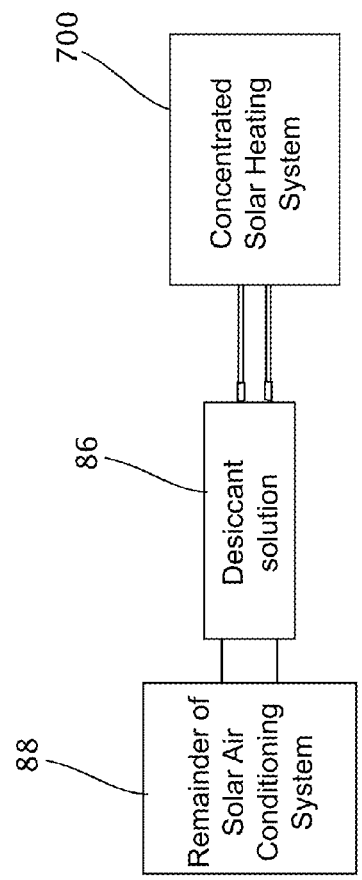
FIG. 3 is a non-dimensionally scaled, schematic diagram of an example solar air conditioning system, according to an embodiment of the present invention.

Reference is now made to FIG. 3 which shows a non-dimensionally scaled schematic diagram of a possible desiccant-based solar air conditioning system according to an embodiment of the present invention. In this system, the working fluid 66 is heated to a high temperature which heated fluid 66 is then used to heat the desiccant 86 for purposes of drying the desiccant. The dried desiccant is then used in the remainder of the air conditioner 88 in the latent heat moisture absorption phase.

Figure 4:
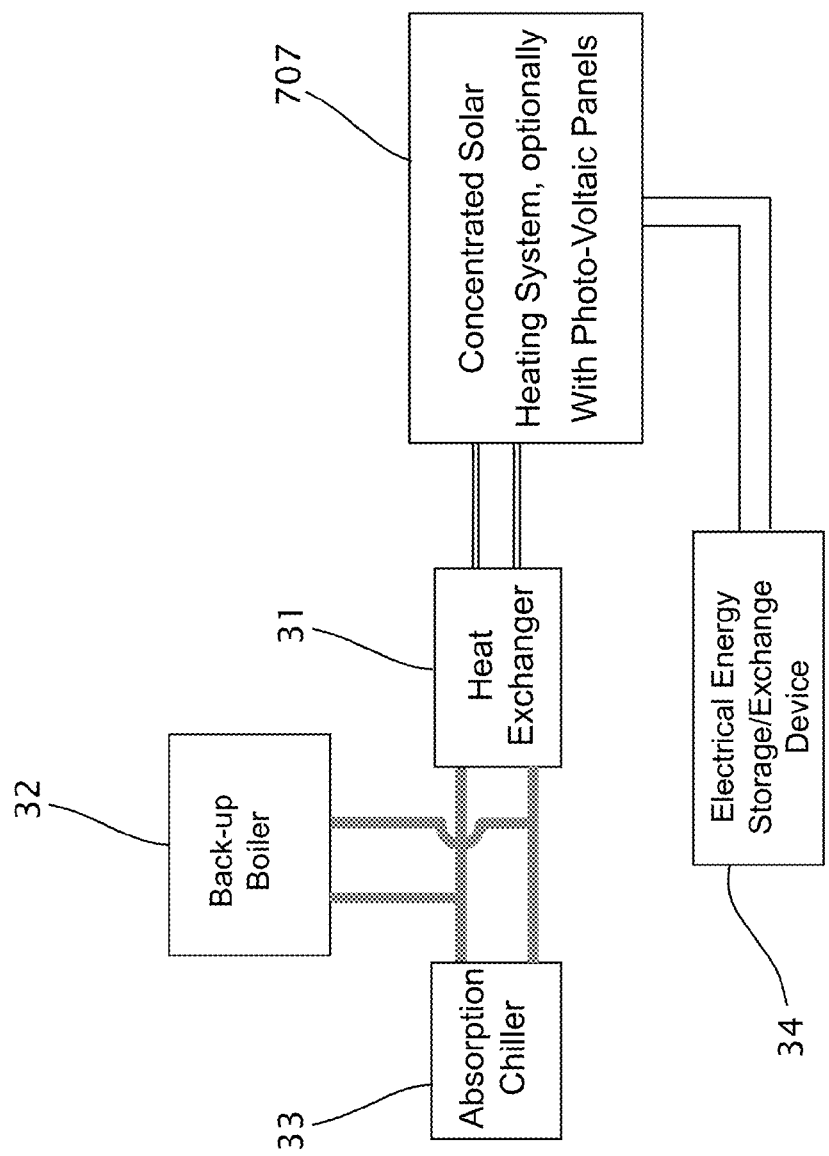
FIG. 4 is a non-dimensionally scaled, schematic illustration of an example solar application involving an absorption chiller, according to an embodiment of the present invention.

Reference is now made to FIG. 4 which shows an example solar application involving an absorption chiller 33 according to an embodiment of the present invention; a solar heating system 707 is used to heat the working fluid 66 is heated to a high temperature which heated fluid 66 gives its heat to the absorption chiller fluid in a heat exchanger 31. An absorption chiller 33 then provides hot and/or cold water or its working fluid 66, hot and/or cold air, for purposes of air conditioning refrigeration or whatever the chiller is designed for. For times when solar heating system 707 is unable to provide the necessary heated working fluid 66, a backup boiler/system 32 may be used. FIG. 4 also shows that photo-voltaic panels can be used for supplying electrical energy to a storage or exchange device 34.

Figure 5:
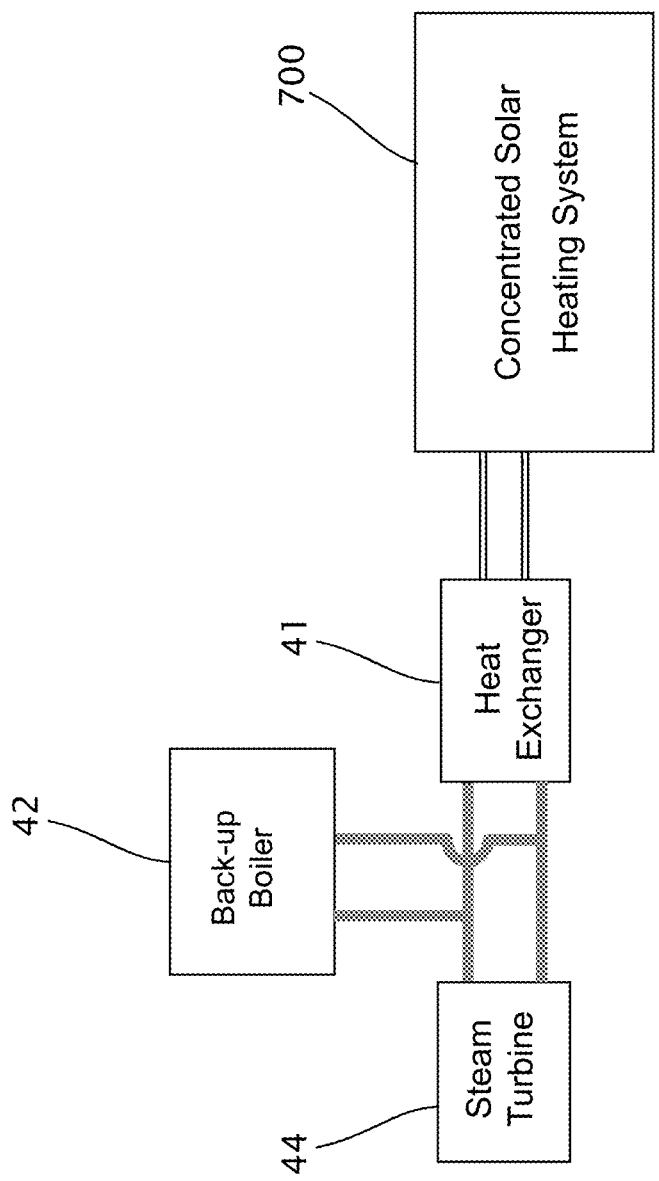
FIG. 5 is a non-dimensionally scaled, schematic diagram of an example solar power application, according to an embodiment of the present invention.

Reference is now made to FIG. 5 showing an example solar power application involving a power generation device, in this example, a steam turbine 44. Since the solar energy collected by solar heating system 700 is concentrated, it is possible for the generated temperature of the water 66 to exceed the vaporization temperature of water, to make steam. The steam could then be used to drive a steam turbine 43 for purposes of making electrical energy.

Reference is now made back to FIGS. 1a and 1b. Receiver unit 722 consists of a first receiving external surface 721, which allows the energy to be transferred to a working fluid 66 flowing in form inlet 725 within first receiving external surface 721. Thus, first receiving external surface 721 represents an enclosure to contain working fluid 66. The working fluid 66 may consist of any suitable liquid or gas depending on the application of solar concentrating system 700. For example, if the application is a home hot water heating system, as shown in FIG. 1b, then the working fluid 66 may be water. In cooler climates, the working fluid 66 may be a substance which does not freeze at typical winter temperatures such as ethylene glycol. In such cases, a second heat exchanger, not exposed to the outside elements, is then used to heat the water. Such systems are in common use in Europe.

Reference is also made to FIG. 6a, a non-dimensionally scaled, side view illustration of receiver subsystem 722 of concentrated solar heating system 700; and to FIG. 6b is a non-dimensionally scaled, bottom perspective view illustration of receiver subsystem 722 of concentrated solar heating system 700. FIG. 6a and FIG. 6b show three fundamental configurations of the receiver unit 722. Receiver unit 722 is made of an outer enclosure 721 and optionally, of an inner enclosure 729, through which enclosures (721, 729) working fluid 66 passes and absorbs the solar energy by conduction. Receiver unit 722 itself absorbs energy incident on receiver unit 722, also by conduction. One purpose for such an arrangement is to preheat the working fluid 66 within the inner enclosure 729 with excess or radiated heat from the first enclosure 721. The radiated heat might otherwise be lost.

Typically, receiver unit 722 is constructed from pipes made of material with a high heat transfer coefficient, such as copper, steel or aluminum and the like.

Preferably, receiver unit 722 is disposed at the center of gravity of the moving assembly, including the reflectors, that pivots about receiver unit 722, receiver unit 722 being generally round. Among other things, this positioning reduces the torque required by a rotation mechanism, such as a motor. This positioning also allows for receiver unit 722 to be situated below the upper edges of the collectors and thereby the collector assembly may be enclosed by a highly transparent cover.

It should be appreciated that FIGS. 6a and 6b show only three embodiments and that virtually any type of inner or outer enclosures may be used, including but not limited to annular inner and outer enclosures, enclosures made of tubing of any cross section shape (but usually circular), inner and outer enclosures which are made of coiled tubing, or any other combination.

Reference is now made to FIG. 7a, is a non-dimensionally scaled, cross-sectional, side view illustration of a concentrated solar heating system for collecting solar energy, according to some embodiments of the present invention, showing an example configuration of reflecting surfaces of panels 812. Solar radiation 10 is incident on reflecting surfaces 812 whose orientation with respect to the sun always allows the incident energy 90 to be reflected to receiver unit 822, receiver unit 822 being generally round. Generally, the center of a reflected beam strikes the corresponding center of receiver unit 822. The width of the reflected energy 90, reflected from a respective panel 812, is less than the width of receiver unit 822. The panels 812 are also placed in such a way that no panel casts a shadow on another. The panels 812 may be spaced accordingly as in the figure to allow for air to pass through if the optional enclosure is not used. Allowing the air to pass through the panels reduces the aerodynamic load on the structure when there are winds.

Referring also to FIG. 7b, a similar cross sectional view to that in FIG. 7a, wherein no gaps are formed between the panels and represents an embodiment with a complete enclosure of the frame structure 830, wherein a highly transparent, substantially flat cover 818 encloses frame structure 830, including receiver unit 822, so that a greenhouse effect is used for greater heating. A second advantage of a complete enclosure of frame structure 830 is the reduction in aerodynamic forces during winds so that the support structure need not be as strong as an open configuration, as shown in FIG. 7a. A third advantage of a complete enclosure of frame structure 830 is the protection offered by the reflective surfaces from falling debris or other environmental hazards. This advantage thus keeps the reflective surfaces clean. It is also far simpler to clean the flat transparent top which is readily available than the mirror segments which are not.

The positions of the panels shown in FIG. 7a and FIG. 7b are for illustrative purposes only, and only show one geometrical embodiment. The number of panels may vary from 1 to as many as desired and can be designed to either reduce the width of the reflected energy or to fit within a certain enclosure size. It should be obvious, though, that more energy will be collected from a larger total projected (toward the sun) area. The figure illustrates a scaled system for a residential hot water heater. Preferably, the width of the reflected energy 90, reflected from a collector onto the receiver, is less than the width of the receiver unit. Reducing the coverage reduces reflective losses, while allowing for a larger solar tracking error, thus permitting lower cost of the tracking mechanism.

Reference is now made to FIG. 7c, is a non-dimensionally scaled, cross-sectional, side view illustration of a concentrated solar heating system 900 for collecting solar energy 10, according to some embodiments of the present invention, showing an example configuration of a continuous reflecting surface 912. The shape of this surface is generally parabolic, the focus of which is either at or near the center of the receiver. It is possible that the two parabolic surfaces (912a and 912b) are separated by a gap 935 so that there are two foci, one for each parabola. In such a case, the two foci are still preferably close to one another and both are near the center of the receiver. When this is the case, an imaginary short line connecting the two foci is termed the "joint foci" or "focal zone". In this example embodiment, receiver unit 922 is enclosed by a substantially transparent elongated receiver-housing 924 having, for example, a generally triangular prism shape. The enclosed by an elongated receiver-housing 924 facilitates the formation of a greenhouse effect, used for greater heating.

Elongated receiver-housing 924 and receiver unit 922 combine to form energy-receiving-module 920. It should be noted that, preferably, elongated receiver-housing 924 pivots along with collectors unit 910, while receiver unit 922, receiver unit 922 being generally round, remains stationary. A stationary receiver unit 922 prevents leaks due to rotary connections of passageways of working fluid 66.

The two transparent walls of receiver-housing 924 that face away from the sun are each facing a different symmetrical section of reflecting surface 912. The reflected radiation 90 is delimited by an upper boundary beam 92, coming from the top of collector 912, and by a lower boundary beam 94, coming from the bottom of collector 912. To reduce the radiation losses, the two transparent walls of receiver-housing 924 that face away from the sun form substantially the same angle $\alpha$ with upper boundary beams 92 and lower boundary beams 94. Doing so minimizes reflection losses from these two transparent walls.

FIG. 7d is a schematic illustration of the ray tracing of the solar energy reflected from collectors 912 to receiver unit 922, having a width $d_r$. The at least one parabolic collector 912 collects the solar energy (90) from the sun and the collected energy is directed at the external surface of receiver unit 922. The collected energy that is directed at the external surface of receiver unit 922 forms a solar energy strip 98 along the external surface of receiver unit 922, wherein strip 98 has a width $d_e$, wherein $d_e < d_r$.

It should be noted that the receiver-housing is not limited to a triangular lateral cross section, and may take any other shape. For example, the receiver-housing may have a circular lateral cross section, that is typically, more expensive to manufacture.

Preferably, a gap (735, see FIG. 1b; 935, see FIG. 7c) is formed at the shaded section of the collectors unit (710, 910), being shadowed by the receiver unit (722, 922). Gap (735, 935) facilitates winds blowing against collectors-assemblies 110, and pass through that gap, and thereby, substantially decreasing the wind blowing resistance of the collectors-assemblies (710, 910). Also, when in idle state, when the collector (710, 910) the solar heating system (700, 900) is turned such that the receiving surfaces face the ground, the gap (735, 935) substantially lowers lifting forces when winds are blowing.

Reference is also made to FIG. 7e, showing concentrated solar heating system 900 for collecting solar energy 10, wherein thermal insulation 927 is disposed in preconfigured spaces inside enclosed elongated receiver-housing 924. In this example embodiment, the top vacant space of receiver-housing 924, which does not receive concentrated energy from the collectors, is insulated by thermal insulation 927a and the bottom vacant space of receiver-housing 924 is insulated by thermal insulation 927b. The reasoning for the insulation is that for a wide temperature working range of receiver unit 922, the loss of heat due to radiation, when the temperature of receiver unit 922 is much higher than its surroundings, is greater than the energy it could receive from the one sun. The example demonstrates the need for insulation, accompanied by FIG. 7f. Assuming the solar irradiance is 1000 W/m², ambient temperature of 25° C., receiver temperature of 200° C., the glass transmissivity is 95% for the solar spectrum and 60% for the receiver spectrum (IR), we compute:

Energy from the Sun=0.95*1000=950 W/m²

Radiation Loss=$0.60\sigma A(T_{rec}^4 - T_{amb}^4)$=(0.60)(5.67× $10^{-8}$)(1)($473.15^4 - 298.15^4$)=1434 W/m²

Hence, Radiation Loss>Energy obtained from the Sun.

That is, receiver unit 922 loses more than it gains by trying to receive solar energy from direct heating. In fact this holds true for temperatures down to about 103° C. under the same conditions. Therefore, it is much better to insulate the portion illuminated directly by the sun rather than try to receive that energy. Optionally, the insulation may have a foil surface nearest to the receiver body which favorably reflects the radiation frequencies of its temperature. Since the radiation frequencies are mostly in the IR range, various metal foils may be used. The insulation may further reduce energy transport from the receiver to the glass enclosure, further slowing energy loss by conduction and convection. Similar remarks hold for any non-illuminated areas, such as the shadowed bottom of receiver unit 922 in FIG. 7f.

Thermal insulation 927 may also be disposed inside enclosed elongated receiver-housing 924, adjacent to non-illuminated regions of receiver unit 922, such as bottom region 96 of receiver unit 922, bounded between lower boundary beams 94.

The reflecting surfaces may be made of any material suitable for reflecting the majority of the incident solar radiation, but preferably made of a highly reflective material. Such materials include front surface mirrored glass, polished aluminum, and other surfaces known in the art for reflecting solar energy. There are also highly reflective films which can be glued to suitable surfaces to act as the mirrors. One such film is the product ReflecTech® Mirror Film (http://www.reflectechsolar.com/) or 3M® which currently has a reflectance of 94%.

It should be noted that in other embodiments of the present invention a single continuous parabolic collector is used, rather than one or more panels 812.

The working fluid 66 may consist of any suitable liquid or gas depending on the application of solar concentrating system. For example, if the application is a home hot water heating system, then the working fluid 66 may be water. In cooler climates, the working fluid 66 may be a substance which does not freeze at typical winter temperatures such as ethylene glycol. In such cases, a second heat exchanger, not exposed to the outside elements, is then used to heat the water.

It should be noted that the receiver unit is not limited to a circular lateral cross section, and may take any other shape. For example, the receiver unit may be triangular, where to lower faces of the generally triangular receiver unit face a respective individual collector (912). In such an embodiment, the receiver unit is rotating along with the collector assembly. The faces of the generally triangular receiver unit may be flat, concave or convex.

An aspect of the present invention is to provide, an innovative receiver unit. FIG. 8 is a side view illustration of an extruded receiver unit 600, according to an embodiment of the present invention. Reference is also made to FIG. 9, a perspective view illustration of receiver unit 600; to FIG. 10, a detailed view of window A, as shown in FIG. 8; to FIG. 11, a perspective view illustration of the receiver unit 600, having one of the two caps 620 removed, for illustrative purposes only; and to FIG. 12 is a detailed view of window B, as shown in FIG. 11.

Referring back first to FIG. 6a, the receiver unit (722) is made of an inner enclosure 729 and an outer enclosure 721 through which working fluid 66 passes and absorbs the solar energy by conduction. The receiver unit (722) itself absorbs energy incident on the receiver unit (722), also by conduction. Typically, the receiver unit (722) is constructed from pipes made of material with a high heat transfer coefficient, such as copper, steel, or aluminum.

Referring back to FIGS. 8-12, receiver unit 600 includes an extruded body 610 sealingly enclosed by a pair of caps 620. Extruded body 610 is manufactured by extrusion, which is a process used to create objects of a fixed, cross-sectional profile. The material, such as aluminum, is pushed or drawn through a die of the desired cross-section.

Extruded body 610 includes an external surface 612 and two open ends, wherein the two open ends are sealingly enclosed by the pair of fitted caps 620. Extruded body 610 is a pipe having an inner space 640, formed by an inner surface 642, wherein extruded body 610 includes a multiplicity of passageways (662, 664 and 650) separated by internal walls (670 and 672), disposed longitudinally between the two open ends. Passageways (662, 664 and 650) are interconnected to form a single elongated-passageway having one flow-inlet (650) and one flow-outlet, being in flow communication with fitted openings formed in caps 620.

The passageways (662, 664 and 650) are arranged in pairs, wherein each pair 660 of passageways is bounded by sealed walls 670 and is separated by a nibbled-wall 672, facilitating flow of fluid between the passageways of the pair 660 of passageways; and wherein an internal wall, that is a sealed wall at one of the open ends of extruded body 610, is a nibbled wall at the other open end of extruded body 610, to thereby form the single elongated-passageway, when enclosed by caps 620.

According to variations of the present invention, reference is also now made to FIG. 13, an isometric view of receiver unit 600, wherein inner-pipes are inserted through passageways (662, 664 and 650). The inner-pipes are interconnected and sealed by a connecting member 692 respectively disposed in the inner space formed at nibbled-wall 672, to thereby form a single elongated pipe 690, having a first end 652 passing through the flow-inlet 650, and connected to the fitted opening formed in a first of caps 620, and second end 652 passing through flow-outlet 650 and connected to the fitted opening formed in the second of caps 620.

According to variations of the present invention, reference is also now made to FIG. 14, an isometric view of receiver unit 600, wherein caps 620 include pairing members 625, integrated therein, and wherein each of pairing members 625 is adapted to enclose and seal the preconfigured pairs 661 of passageways, separated by (non-nibbled) inner walls 670, facilitating flow of fluid between the passageways of each pair 661 of passageways, when enclosed by caps 620. Pairing members 625 of a respective one of caps 620, is configured to enclose non-overlapping adjacent pairs 661 of the passageways, with respect to pairing members 625 of the other cap of caps 620, to thereby form the single elongated-passageway in a back and forth manner.

Preferably, extruded body 610 further includes an alignment hollow cavity 680, formed at the open ends, facilitating fast and error-free enclosure of the pair of caps 620. An alignment insert is inserted though hollow cavity 630, formed in each cap 620, and through hollow cavity 680.

Preferably, caps 620 are substantially identical.

Figure 15:
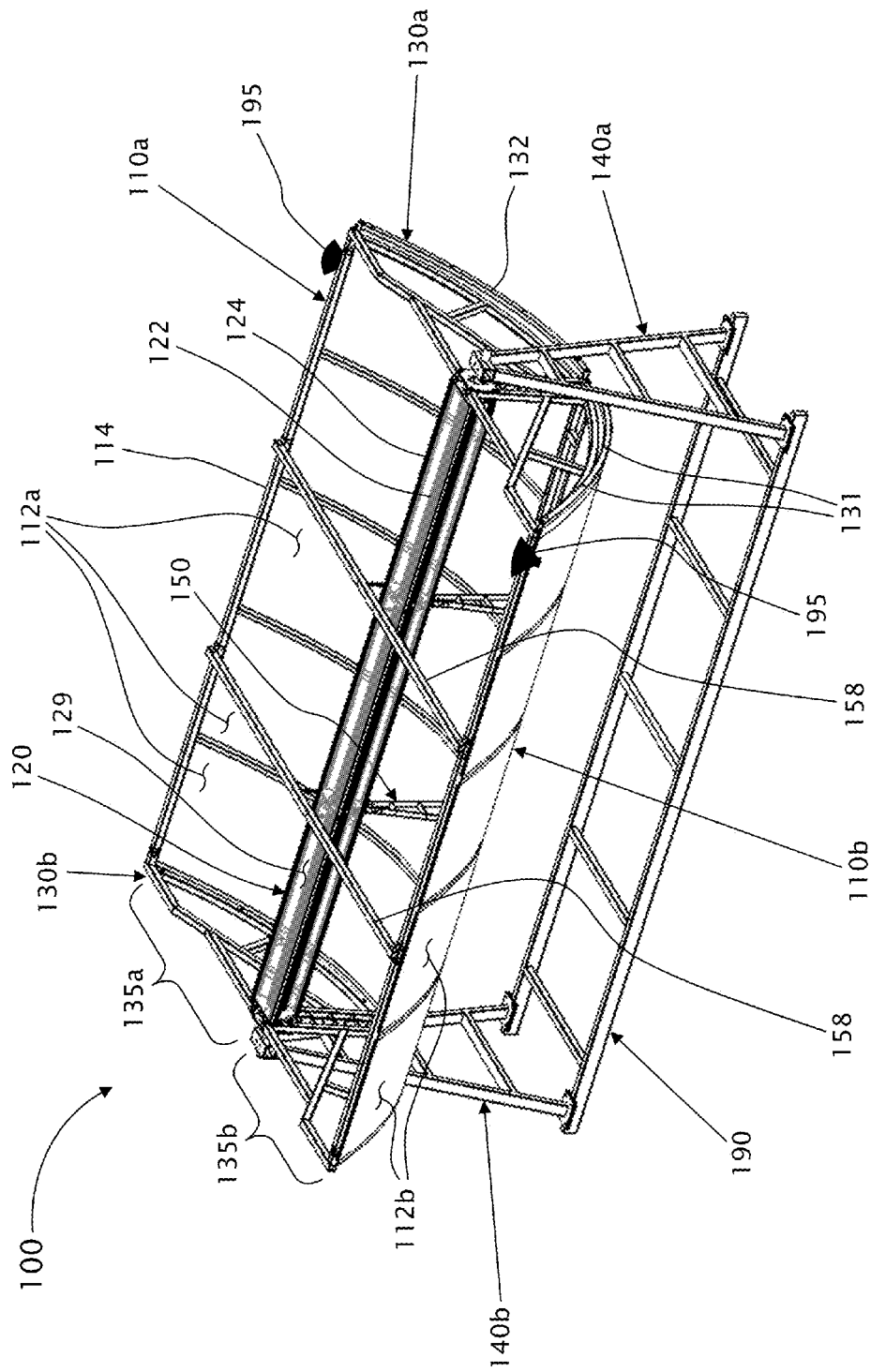
FIG. 15 is an isometric view illustration of a modular solar system for collecting solar energy, according to embodiments of the present invention.
Figure 16:
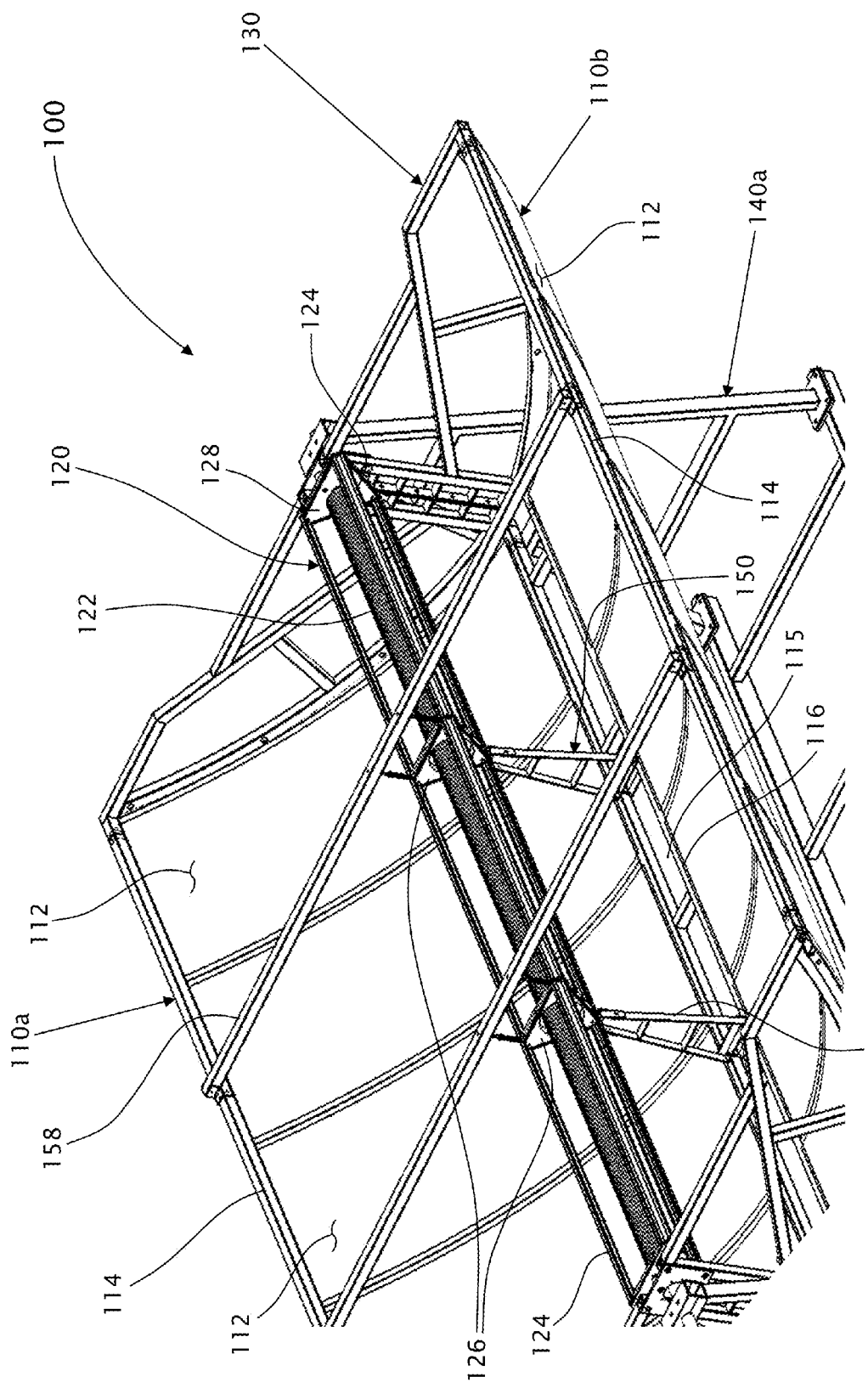
FIG. 16 is an isometric view illustration of a portion of the modular solar system shown in FIG. 15.

Reference is now made to the drawings. FIG. 15 is an isometric view illustration of a modular solar system 100, according to embodiments of the present invention. FIG. 16 is an isometric view illustration of a portion of the modular solar system 100. Modular solar system 100 includes a solar energy collector-assembly 110, an energy-receiving-module 120 having a receiver unit 122 that has a generally circular lateral cross section, a support structure and a rotating mechanism such as a motor facilitating pivotal motion of the collector-assembly, by a sun-following mechanism, and a control-subsystem. In one embodiment, the support structure includes a pair of side-structures 130 a pair of stands 140, longitudinal bars 114 and 116, and cross bars 158.

Figure 17:
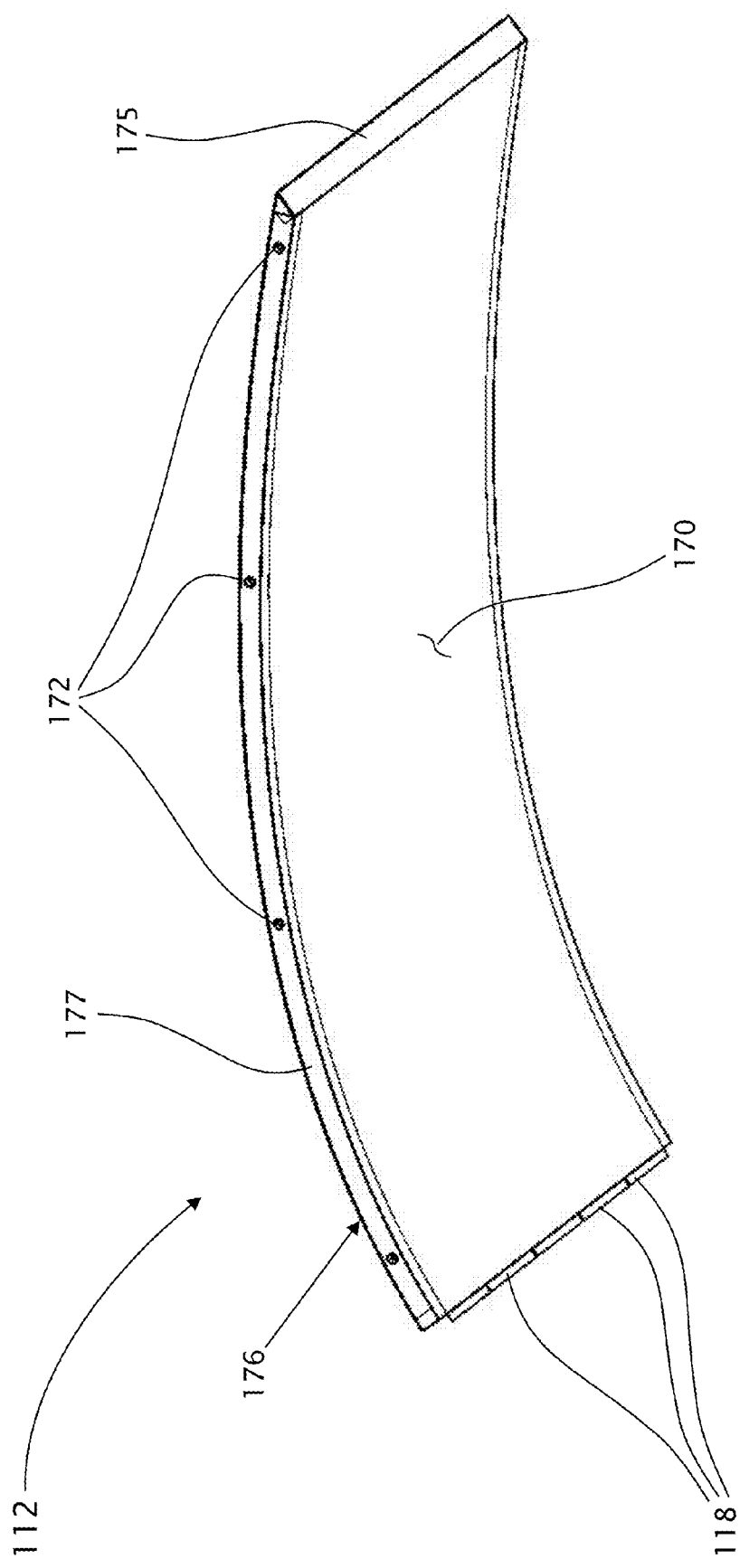
FIG. 17 is a bottom isometric view illustration of an individual-collector, according to embodiments of the present invention.
Figure 18:
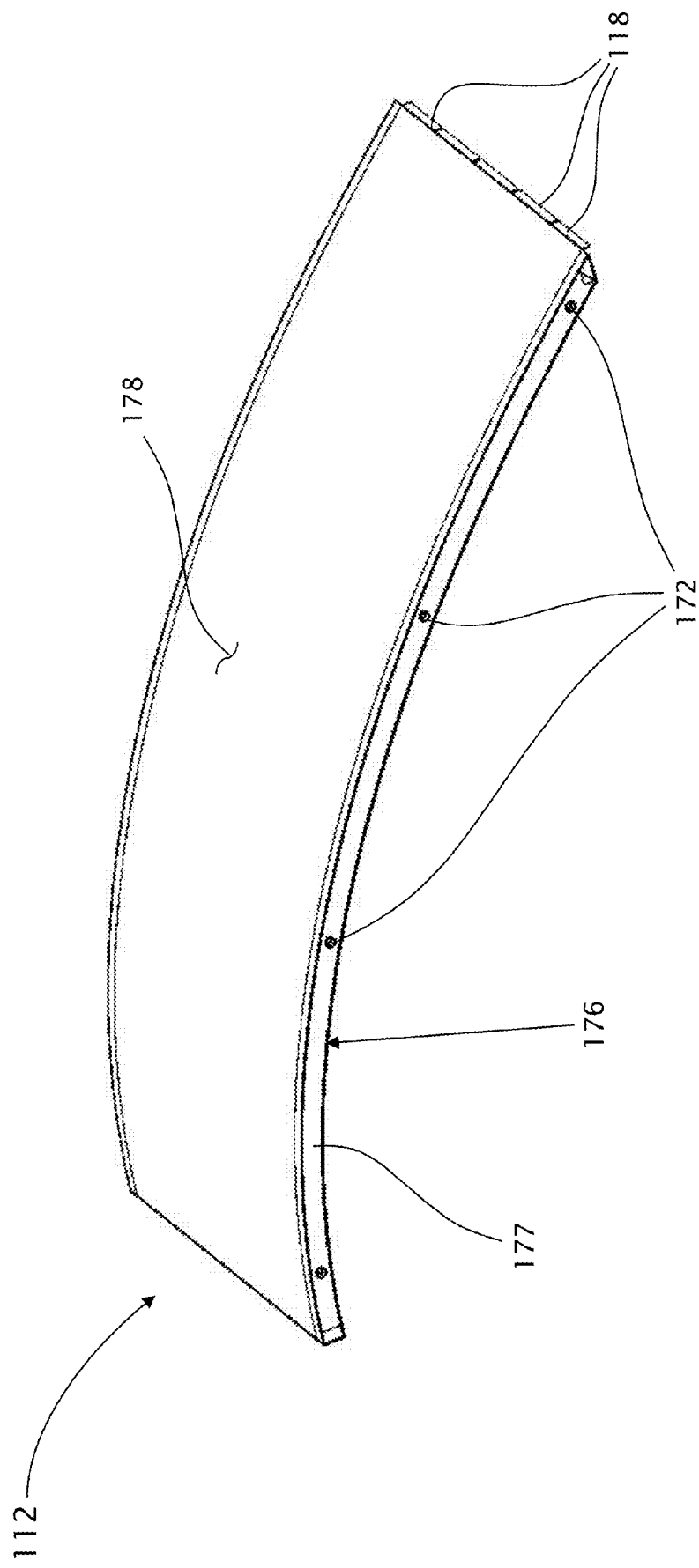
FIG. 18 is an isometric view illustration of the individual-collector shown in FIG. 17.

Collector-assembly 110 includes a multiplicity of substantially identical individual-collectors 112 arranged in rows, for example, in two rows 110a and 110b. Reference is also made to FIG. 17, a bottom isometric view illustration of an individual-collector 112, according to embodiments of the present invention; and to FIG. 18, a top isometric view illustration of individual-collector 112. An individual-collector 112 includes a concave reflecting sheet 170, a collector-frame 176 and, typically, with no limitation, a convex back-cover-sheet 178.

Concave reflecting sheet 170 is typically constructed of lightweight sheet-metals or fiberglass (or any other material with similar properties) coated with reflective materials such as, with no limitations, Mylar® reflective film ("Mylar"), having high reflective properties. Mylar is lightweight is typically applied to the sheet-metal with rollers. Stiffness is provided to an individual-collector 112 by either using fiberglass on the sheet-metal frame 176 or preferably, by foam-filled sheet-metal box formed by concave reflecting sheet 170, collector-frame 176 and convex back-cover-sheet 178. Individual-collectors 112 are very light in weight but are also very stiff to avoid optical distortion. The concave curvature of reflecting sheet 170 is designed to be substantially optimal for specific PV (Photo-Voltaic) panel, but can also be used for thermal applications, wherein no modification is required to the individual-collector 112.

Figure 19:
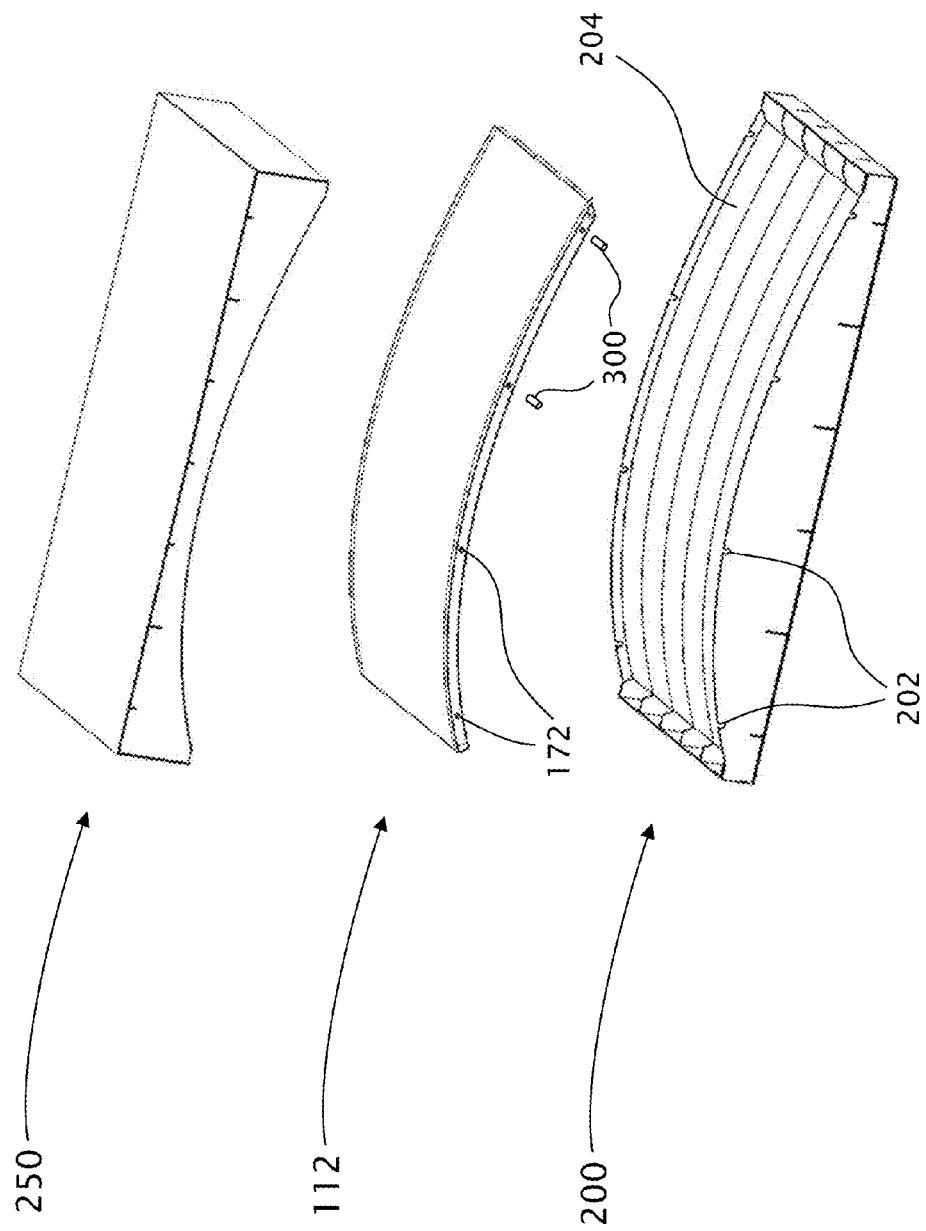
FIG. 19 is an isometric exploded view illustration of the individual-collector shown in FIG. 17, and a mold for manufacturing thereof.

Each individual-collector 112 is preferably fabricated by a mold to thereby guarantee a specific contour of the individual-collector 112. Reference is also made to FIG. 19, an isometric exploded view illustration of individual-collector 112, and the mold for manufacturing thereof; to FIG. 20, an isometric exploded view illustration of individual-collector 112 and the base part 200 of the mold, wherein the back-cover-sheet (178) of individual-collector 112 has been removed for illustrative purposes only; and to FIG. 21, an isometric view illustration of individual-collector 112 and the mold, in a molding state. The mold includes a base part 200 and a pressing part 250, wherein concave reflecting sheet 170 is pressed against the top convex surface of base part 200, and back-cover-sheet 178 is pressed down by the concave bottom surface of pressing part 250. Typically, spacers 70 are used when molding, to hold the collector sheets 170 and 178 in place.

The mold is made of substantially rigid materials, such as steel, to ensure stiffness. Preferably, the mold is made from fool-proof parts to prevent miss-assembly.

Preferably, individual-collectors 112 include threading-tubes 174, through which threading-tubes 174 openings a tie-rod can be threaded, facilitating tie-rod assembly. Threading-tubes 174 are an integral part of each individual-collector 112 and are aligned during manufacturing, at preconfigured positions. Apertures 172 are formed in the sides of frame 176 at preconfigured positions, wherein threading-tubes 174 are securely attached to sides of frame 176 such that apertures 172 coincides with the openings of threading-tubes 174. In some embodiments of the present invention, each individual threading-tube 174 has a larger end-pipe-interface 173 securely attached at each end of individual threading-tube 174, such that the internal diameter of end-pipe-interface 173 is facilitated to fittingly accommodate the external diameter of threading-tube 174 as well as the external diameter of a threading-tube 174.

To ensure the positioning of threading-tubes 174, niches 202 are formed at preconfigured locations at the sides of base part 200. Base part 200 further includes raised-side-walls 201, adapted to accommodate side walls 176, wherein raised-side-walls 201 have a height that is at least half the height of side walls 176 and less than the full height of side walls 176, and wherein niches 202 are formed in side walls 176, at preconfigured locations, extending down to a preconfigured height, to ensure alignments between adjacent individual-collectors 112.

Spacer-nipples 300 are removably fitted into openings of end-pipe-interface 173 or an elongated tie-rod 302 is fittingly passed through threading-tubes 174 or any other similar methods, and wherein the open end of spacer-nipples 300 or elongated tie-rod 302 is fittingly disposed inside the respective niche 202, such that when molding, threading-tubes 174 are repetitively aligned, facilitating interconnecting of individual-collectors 112 to form a single row, with no misalignments.

Figure 20:
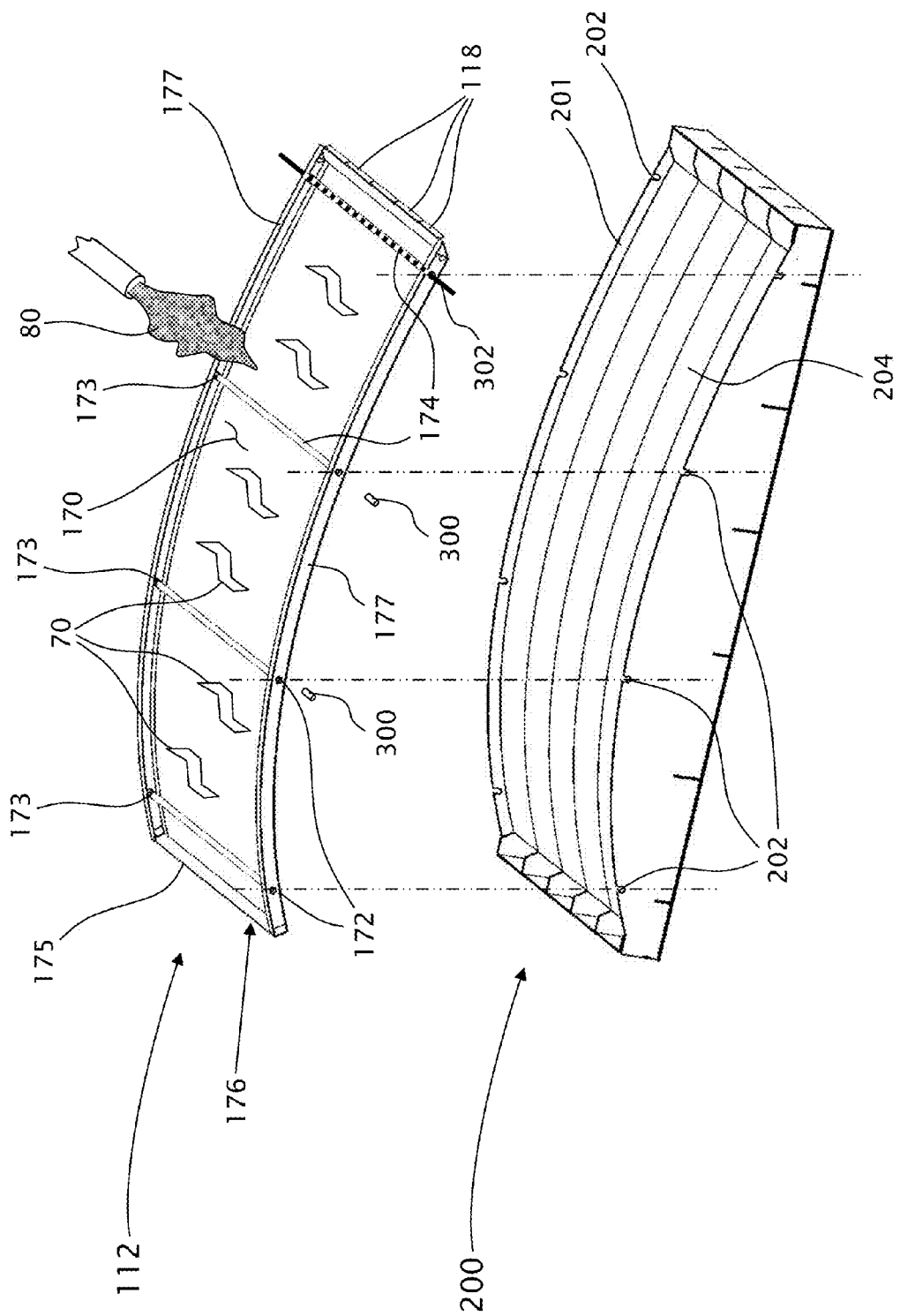
FIG. 20 is an isometric exploded view illustration of the individual-collector and the bottom part of the mold, as shown in FIG. 19, wherein the back cover of the individual-collector has been removed for illustrative purposes only.

After all components of individual-collectors 112 are in place, the sheet-metal box formed by concave reflecting sheet 170 and collector-frame 176 are filled with foam 80 (see FIG. 20). Concave reflecting sheet 170 is now disposed on top of base part 200 of the mold. Convex back-cover-sheet 178 is disposed on top of collector-frame 176 filled with still soft foam 80, and pressing part 250 of the mold is place on top of back-cover-sheet 178, pressing onto the assembly being formed, until foam 80 is hardened. It should be noted that an aspect of the present invention is to provide a modular solar system, having portable components, to thereby facilitate on-site assembly and possibly, partially manufacturing, including the molding of the individual-collectors 112.

Figure 22B:
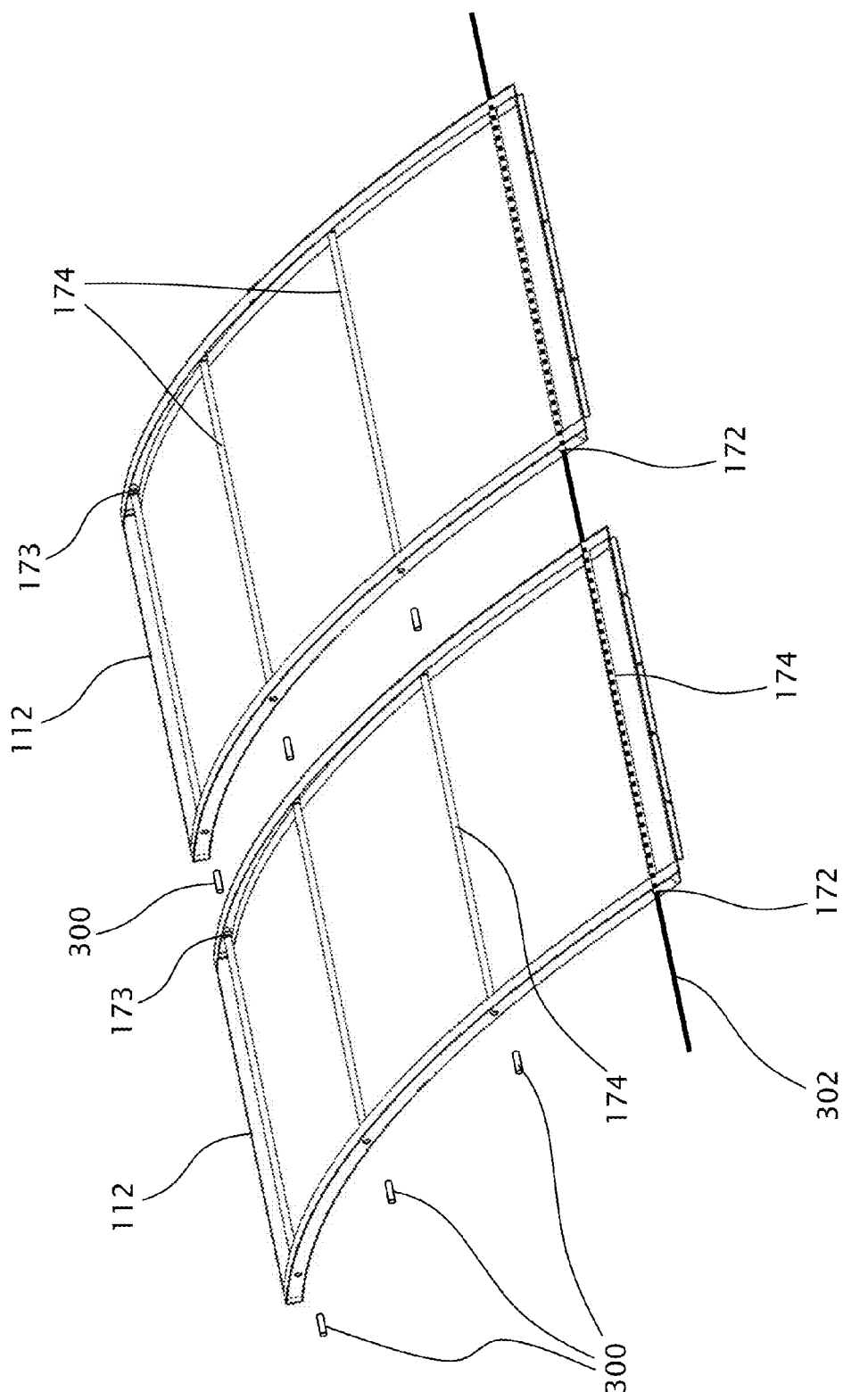
FIG. 22b is an isometric view illustration of the initial assembly step of the collector-assembly, being assembled from individual-collectors, according to embodiments of the present invention.

Reference is also made to FIG. 22a, a side, partially sectioned view of a pair of individual-collectors 112, assembled together using spacer-nipples 300; and to FIG. 22b, a top isometric view illustration of the initial assembly step of collector-assembly 110 from individual-collectors 112, according to embodiments of the present invention. To fittingly connect one individual-collector 112 to another, a spacer is inserted inside adjacent end-pipe-interface 173 of the respective threading-tube 174 of each individual-collector 112. Preferably, the inner of spacer-nipples 300 is substantially the same as the inner diameter of threading-tube 174, to thereby facilitate smooth passage inside threading-tubes 174 throughout each row of collector-assemblies 110.

To tighten a row of individual-collectors 112 together, a tie-rod assembly is, for example, used. Elongated tie-rods 302 is fittingly passed through respective threading-tubes 174 and through respective holes 131 (see FIG. 15), formed at corresponding preconfigured locations in enclosing bars 132 of side-structures 130, to coincide with the respective apertures 172 of the adjacent individual-collector 112, and are securely tightened to the respective side-structures 130.

Figure 23:
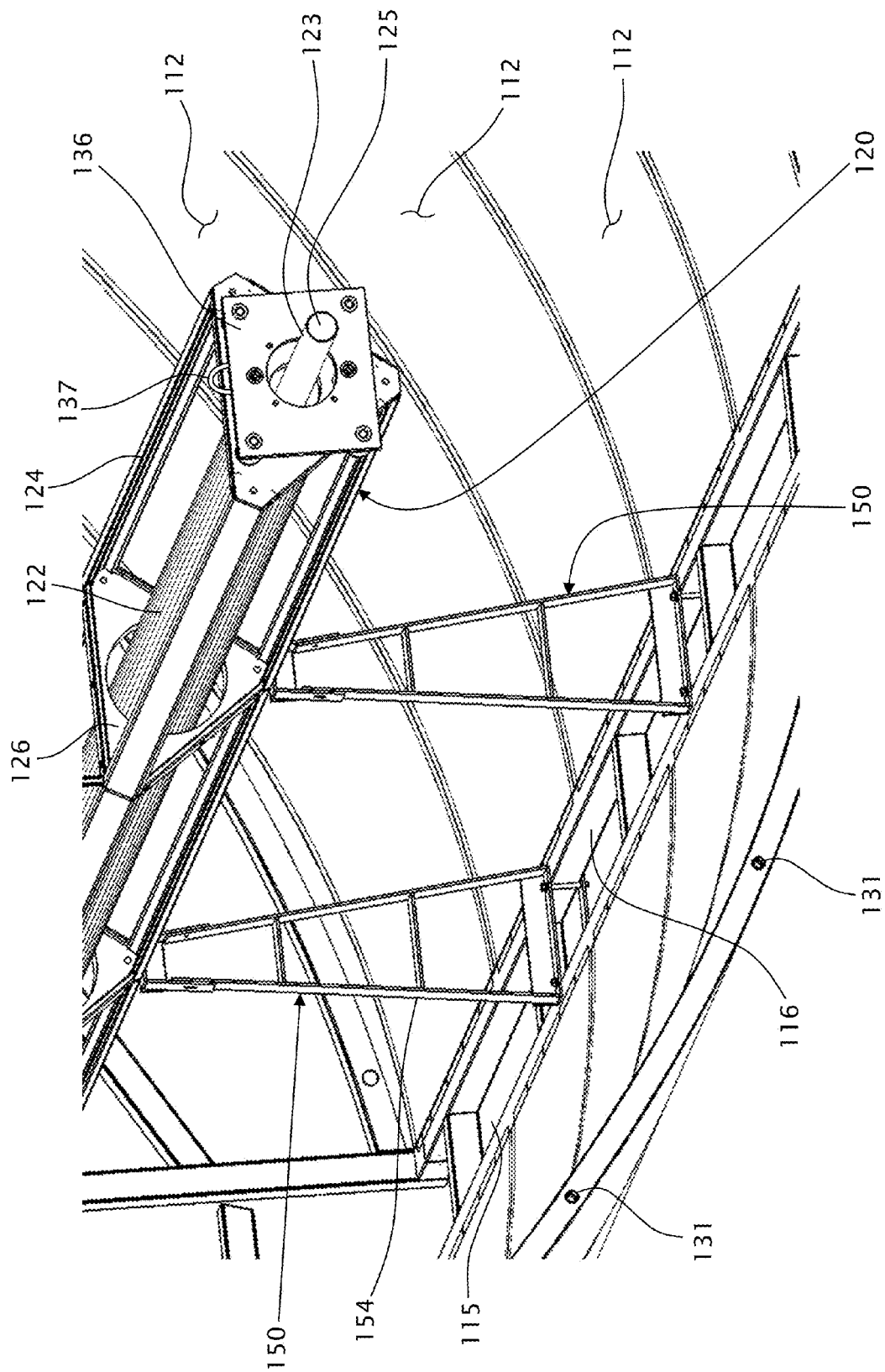
FIG. 23 is an isometric view illustration of a portion of the modular solar system shown in FIG. 15, showing the interrelation between the energy-receiving-module and the collector-assembly, wherein the energy-receiving-module is disposed at the focal zone of the collector-assembly and the center of gravity of the rotating portion of the system.
Figure 24:
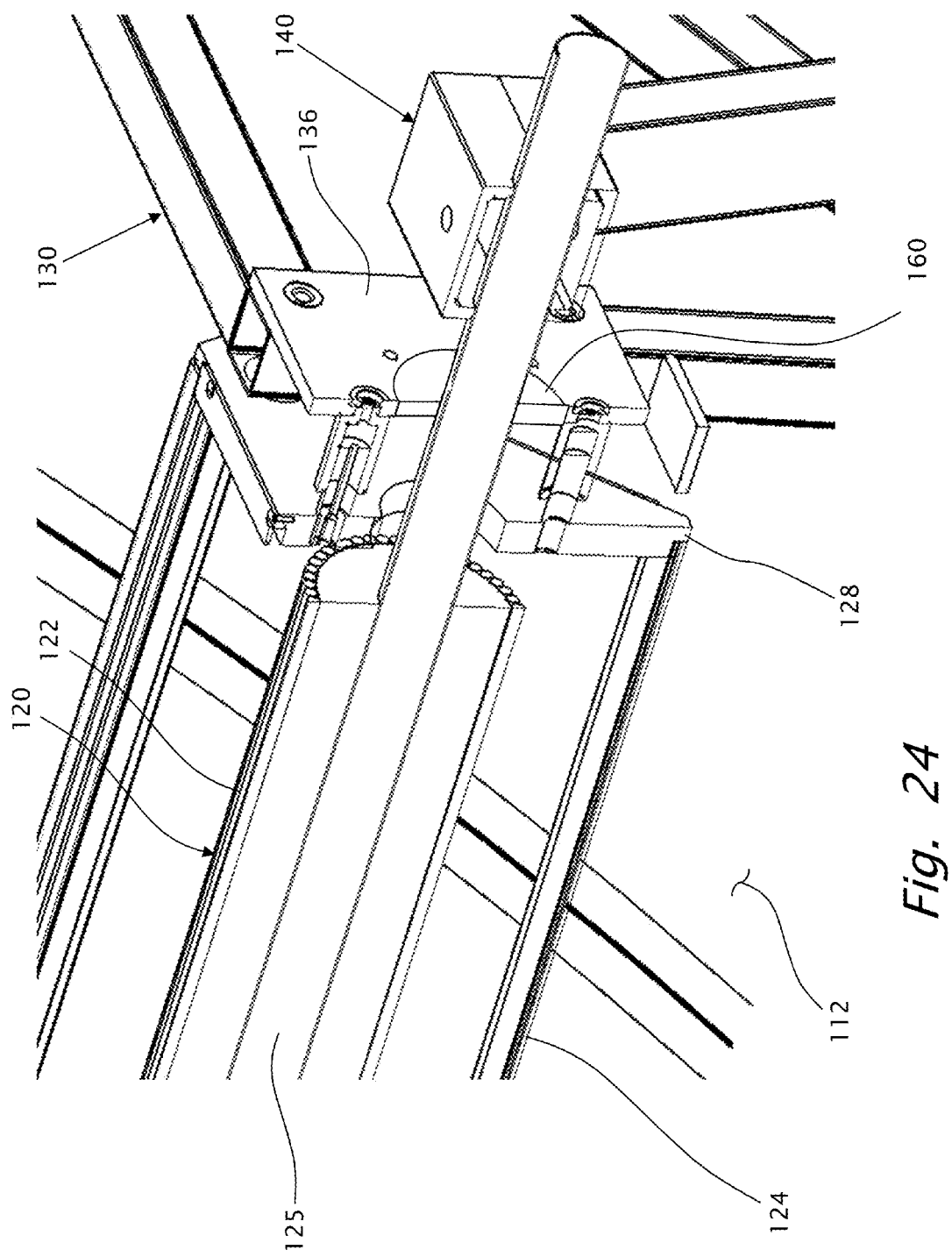
FIG. 24 is an isometric cross-sectional view illustration of a portion of the energy-receiving-module of the modular solar system shown in FIG. 15.
Figure 25:
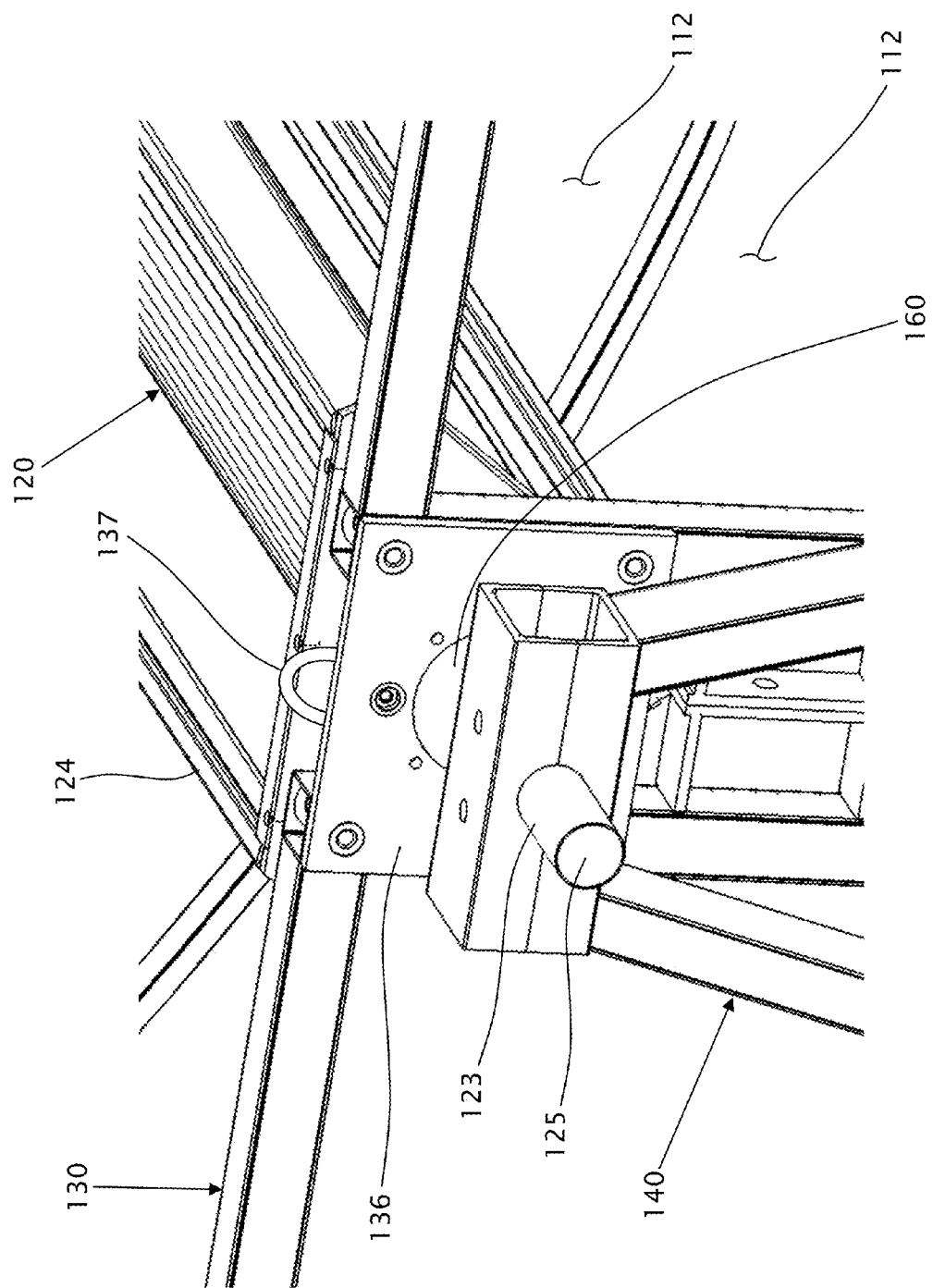
FIG. 25 is an isometric cross-sectional view illustration of a portion of the modular solar system shown in FIG. 15, showing the motion interrelation between the energy-receiving-module and the main support structure.

Reference is now made to FIG. 23, an isometric view illustration of a portion of modular solar system 100, showing the interrelation between energy-receiving-module 120 and collector-assembly 110; to FIG. 24, an isometric cross-sectional view illustration of a portion of the modular solar system 100, showing interrelation between energy-receiving-module 120 and the main support structure; and to FIG. 25, an isometric cross-sectional view illustration of a portion of the modular solar system 100, showing more angles of the interrelation between the energy-receiving-module 120 and the main support structure.

The energy-receiving-module 120 includes two main components: a receiver unit 122, made of tubing and arranged either in a circle or drawn aluminum, and an elongated receiver-housing 124 having, for example, a generally triangular prism shape. Receiver unit 122 and the whole water circulation system (typically including a pump) are similar to the receiver unit (722) as shown in FIG. 6b. Preferably, receiver unit 122 has multiple water paths, facilitating high flow rate. Typically, standard tubing is used for thermal applications, and is typically either made of copper or galvanized steel.

Typically, elongated receiver-housing 124 has, for example, a drawn aluminum frame and is enclosed by walls 129 (see FIG. 15, removed from other Figures for the sake of clarity only) made of substantially clear materials, such as glass ("glass"), and wherein the walls can be either protecting clear glass panels or PV panels. The angles of the glass panels are optimally preconfigured to minimized reflective loss (as described with reference to FIG. 7c). Typically, the glass panels are held in position using standard rubber grommets. It should be noted that the glass encasing increases heat absorption from direct and indirect radiation, due to the greenhouse effect. Typically, the elongated receiver-housing 124 has a generally triangular prism shape, wherein a first face of the prism shaped receiver-housing 124 faces away from wings 135, and each of the other two faces of the prism shaped receiver-housing 124, face a respective wing 135 (see FIG. 15).

Figure 26:
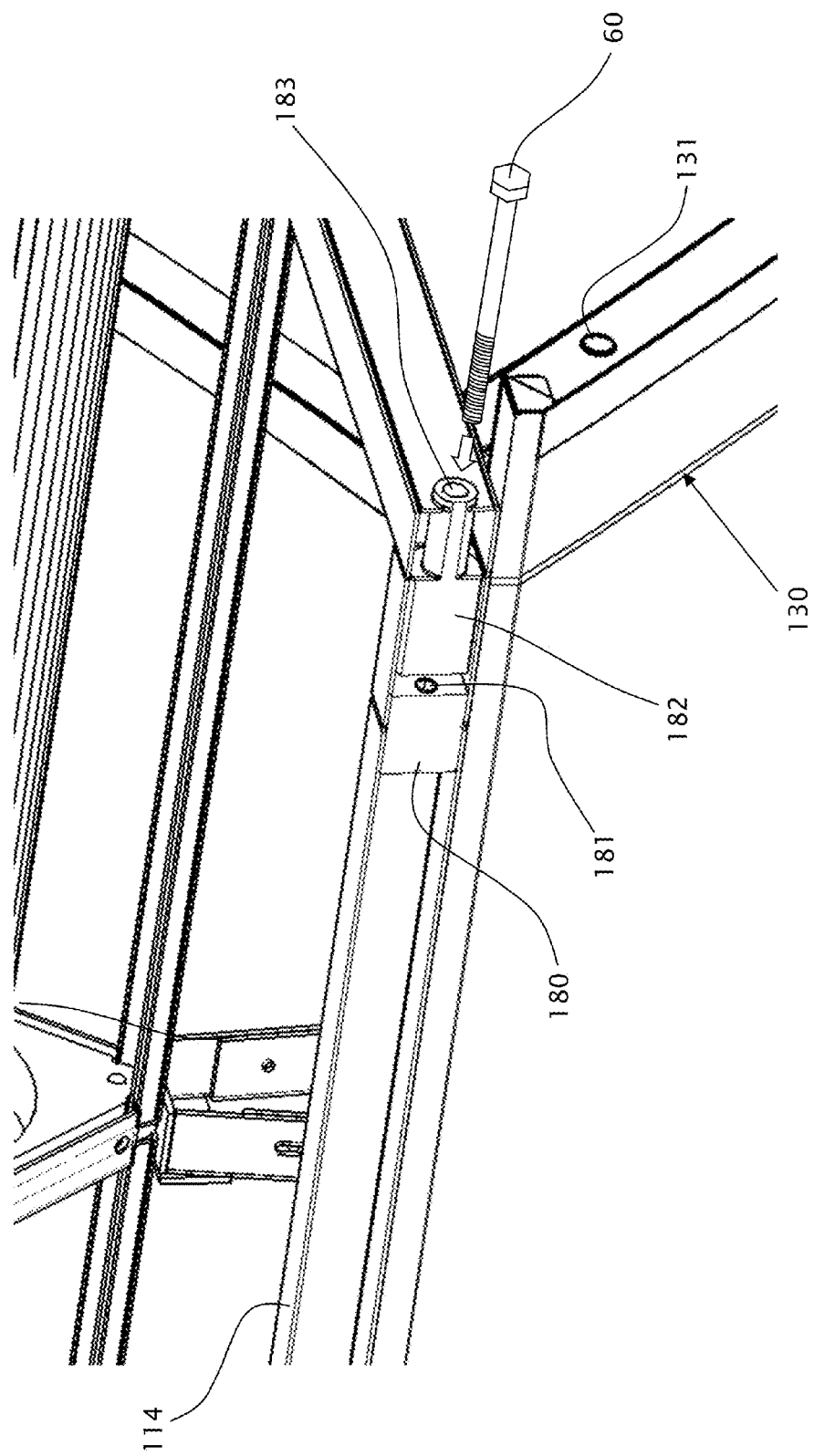
FIG. 26 is an isometric view illustration of a portion of the modular solar system shown in FIG. 15, showing an example tightening mechanism of the collectors' tightening bars.
Figure 27:
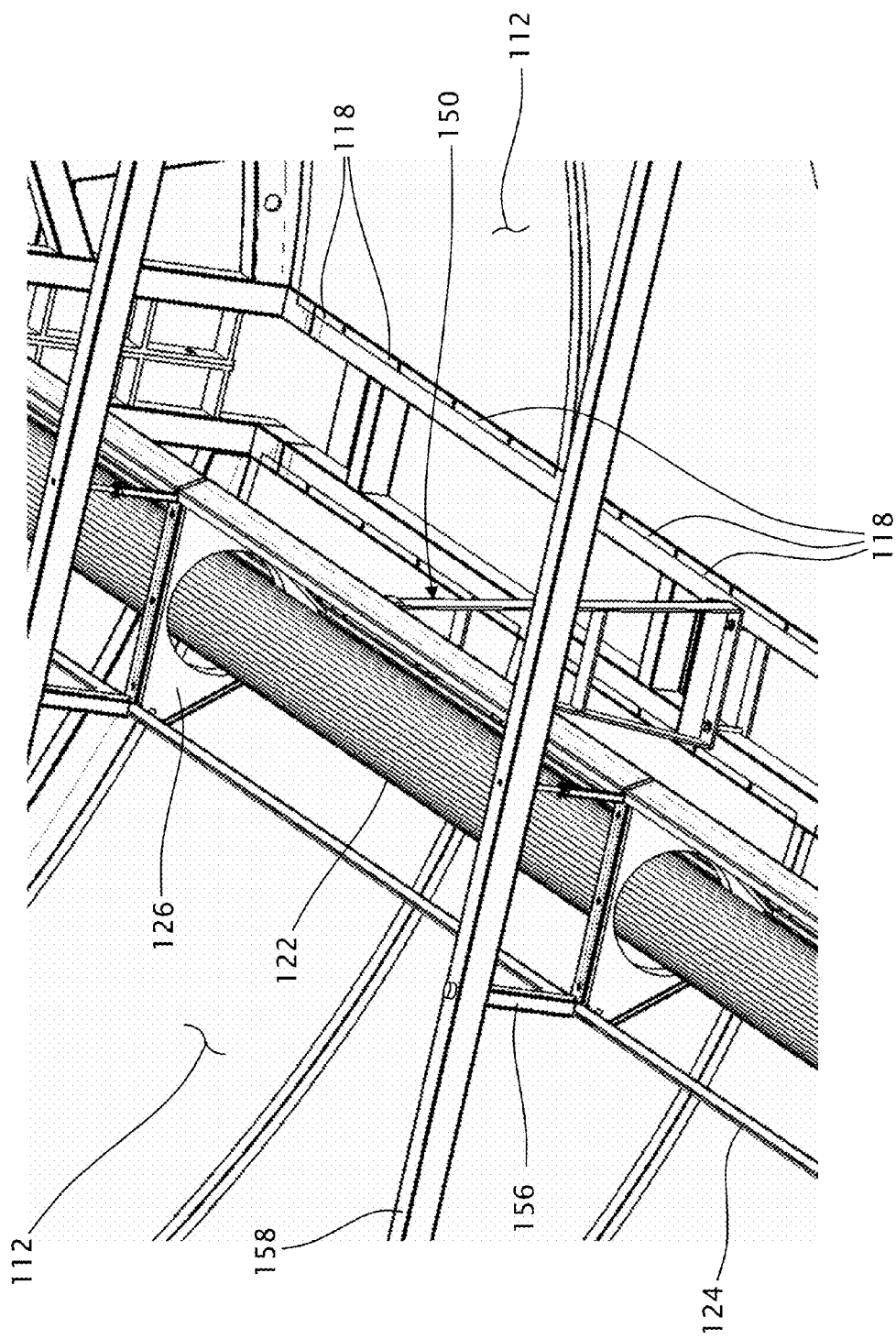
FIG. 27 is a top isometric view illustration of a portion of the modular solar system shown in FIG. 15, showing a portion of the mechanism for securely attaching the energy-receiving-module to the collector-assembly.

In an embodiment of the present invention, the main support structure includes a pair of side-structures 130 a pair of stands 140, longitudinal bars 114 and 116, and cross bars 158. Reference is also made to FIG. 26, an isometric view illustration of a portion of the modular solar system 100, showing an example tightening mechanism of the collectors' tightening bars 114; to FIG. 27, a top isometric view illustration of a portion of the modular solar system 100, showing a portion of the mechanism securely attaching energy-receiving-module 120 and collector-assembly 110; to FIG. 28, an isometric cross-sectional view illustration of a portion of the modular solar system 100, showing ladder bar 116 interconnecting the two rows of collectors; and to FIG. 29, an isometric view illustration of a portion of the modular solar system 100, showing the interrelation between collectors 112 and a collectors' tightening bar 114.

Each row of individual-collectors 112 is tightly encased into a collector-assembly 110 by side-structures 130, longitudinal bars 114 and a longitudinal side of ladder bar 116. Alignment elements 118 facilitate easy placing of individual-collectors 112 against bars 114 and 116. Side-structures 130 terminate each of the two collectors-assemblies 110, and facilitate the tightening of the individual-collectors 112 to each other, using the tie-rod assembly described here above. FIG. 26 shows an example of tightly secured side-structures 130 to bars 114 and 116. A bolt 60 is inserted through opening 183 formed in element 182 and tightly screwed into respective threads 181 of element 180.

It should be noted that the opened gap 115, formed inside ladder bar 116, facilitates winds blowing against collectors-assemblies 110, to pass through, and thereby, substantially decreasing the wind blowing resistance of the collectors-assemblies 110. This is related to gap 735 and 935, as described here above.

Receiver unit 122 is typically stationary and optionally, the working fluid flows in and out of receiver unit 122 through inlet/outlet 125 in a re-enforced central pipe 123. Receiver-housing 124 is securely attached, by receiver-housing fixation structures 150, to collector-assembly 110 that are movably tracking the path of the sun. Central pipe 123 is securely attached, on each end, to a substantially upright stand 140, such that preferably, central pipe 123 is substantially horizontal. Stands 140 are disposed on the ground, a hard surface or on a rigid structure, such as base-structure 190 (see FIG. 1).

The pair of side-structures 130 are pivotally mounted on central pipe 123, facilitating pivotal motion of collector-assembly 110, along with receiver-housing 124, when tracking the path of the sun. Side-structures 130 include a pivotal-mechanism, such as bearings 160 (see FIGS. 24 and 25), facilitating pivotal motion of collector-assembly 110.

Receiver-housing 124 includes generally triangular internal enforcing-dividers 126 and end-covers 128. Each end-cover 128 is securely attached to a respective side-structure 130. For example, as shown in FIG. 24, end-cover 128 is tightened and securely attached to a plate 136 that is securely attached to a respective side-structure 130.

Preferably, for enforcement and durability of modular solar system 100, one or more internal enforcing-dividers 126 are securely connected to the main frame structure. For example, as shown in FIGS. 15, 16, 23 and 27, enforcing-dividers 126 is securely connected to receiver-housing fixation structures 150. At one side (see FIG. 27), an enforcing-divider 126 is securely connected to a respective cross bar 158 via structure spacers 156. At the opposing side, enforcing-divider 126 is securely connected to a ladder bar 116 via structure element 154. Thereby, when collector-assembly 110 pivots to track the sun motion, receiver-housing 124 also pivots.

Typically, most of the components of the frame-assembly are assembled with bolts and lock washers.

The main frame-assembly profiles are made of substantially rigid materials, such as steel, for stiffness.

Preferably, the sun-following mechanism is a single axis type with a chain and sprocket drive. It should be noted that the collector-assembly 110 is operatively positioned such that individual-collectors 112 are facing the East in the morning and the West in the evening, wherein the sun-following mechanism tracks the sun's daytime motion. However, when the modular solar system 100 is used further from the equator, the sun rays form an angle with respect to the rotation axis of collector-assembly 110. One way to compensate for the loss in energy, resulting from that sub angle, is to elongate each collector-assembly 110 at the side proximal to the equator.

The control-subsystem (not shown) is adapted to control the flow rate of the selected working fluid 66 within receiver unit 122, typically by using a modulated flow temperature controlled pump (not shown), to thereby keep the temperature of the selected working fluid within 66 a predetermined range.

Figure 30A:
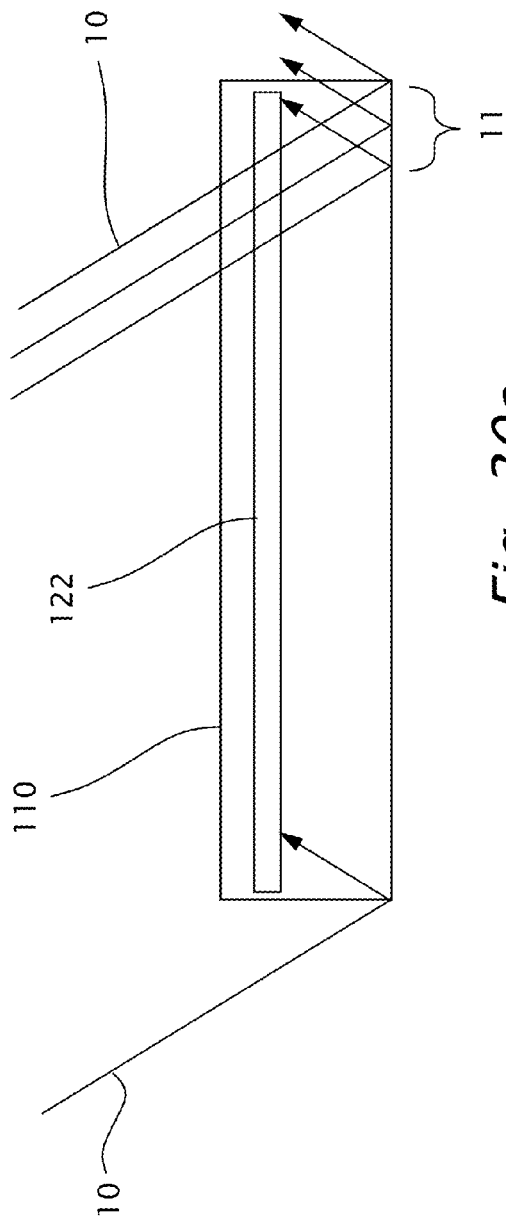
FIG. 30a shows a side view of an embodiment of the present invention showing the loss of energy that occurs at the end of a parabolic trough collector when the sun is at a lower angle than directly overhead.
Figure 30B:
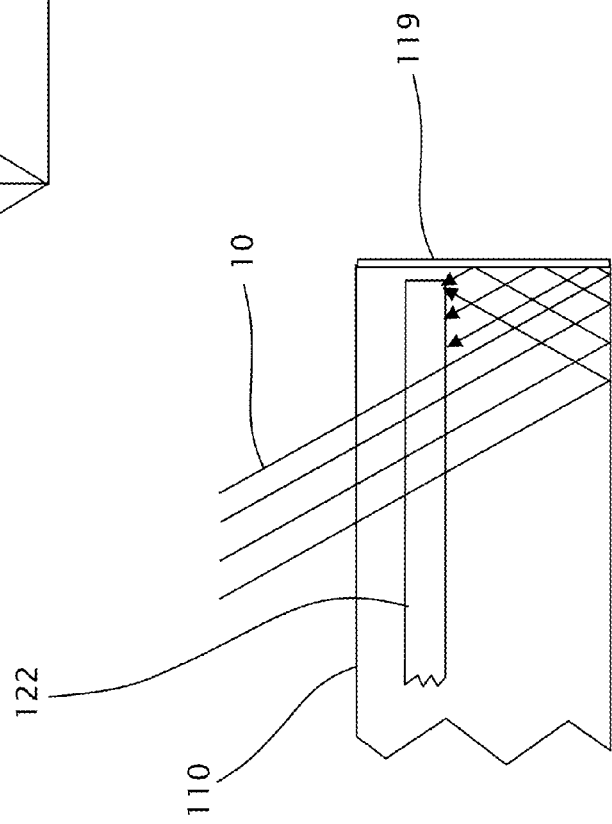
FIG. 30b shows how this lost energy may be substantially recovered by placing a flat mirror at that end.

Referring also to FIG. 30*a*, schematically illustrating loss of solar energy 10 due to reflection off the end of a collector 110 which misses receiver unit 122, at lower sun angles. To compensate for the lower sun angle at times of the year when the sun is less overhead, a flat, substantially reflective end-surface 119 is added at the end of collector-assembly 110, as shown in FIG. 30*b*, where the sun's rays reflect away from the receiver denoted by energy segment 11. Reflective end-surface 119 is protruding generally towards the sun. Energy segment 11 reclaimed by reflective end-surface 119, which energy segment 11 is reflected back to receiver unit 122. Using such a reflector removes the necessity of making very long parabolic reflecting systems to reduce such a loss to a small fraction. It should be noted that the loss due to the lower sun angle is greater for systems where the receiver is at a large distance from the collector.

It should be noted that the two parabolic surfaces (of 112*a* and 112*b*, see FIG. 15) are separated by a gap 115, such that parabolic collectors 112*a* and parabolic collectors 112*b* may operate independently. There are two foci, one for each parabola. In such a case, the two foci are still preferably close to one another forming a focal zone which is substantially symmetric about the center of receiver unit 122. The foci are selected such that the energy reflected from parabolic collectors 112*a* and 112*b* to receiver unit 122 cover slightly less than the width d of receiver unit 122.

It should be noted that the pre-configured diameter of receiver unit 122 allows for a relaxed tolerance of the tracking error. The parabolic collectors 112 are designed to concentrate solar energy onto a portion of receiver unit 122. Reducing the coverage reduces reflective losses, while allowing for a larger solar tracking error, thus permitting lower cost of the tracking mechanism 195.

Therefore, tracking correction may be performed in an intermittent mode, rather than in a continuous mode. The reduced requirement for tracking accuracy reduces substantially the cost of the sun tracking mechanism. The intermittent mode operation of tracking mechanism 195 also permits for a braking system (not shown) to be used with tracking mechanism 195. A braking sub-system, controlled by the control-subsystem, is configured to lock the pivotal motion of the support structure about the shaft, when the sun-following mechanism is not in operation. The braking system increases the system rigidity, diminishes the tendency for collector vibration and thus lowers the cost of the support structure and maintenance cost, and increases stability in high winds.

Figure 31:
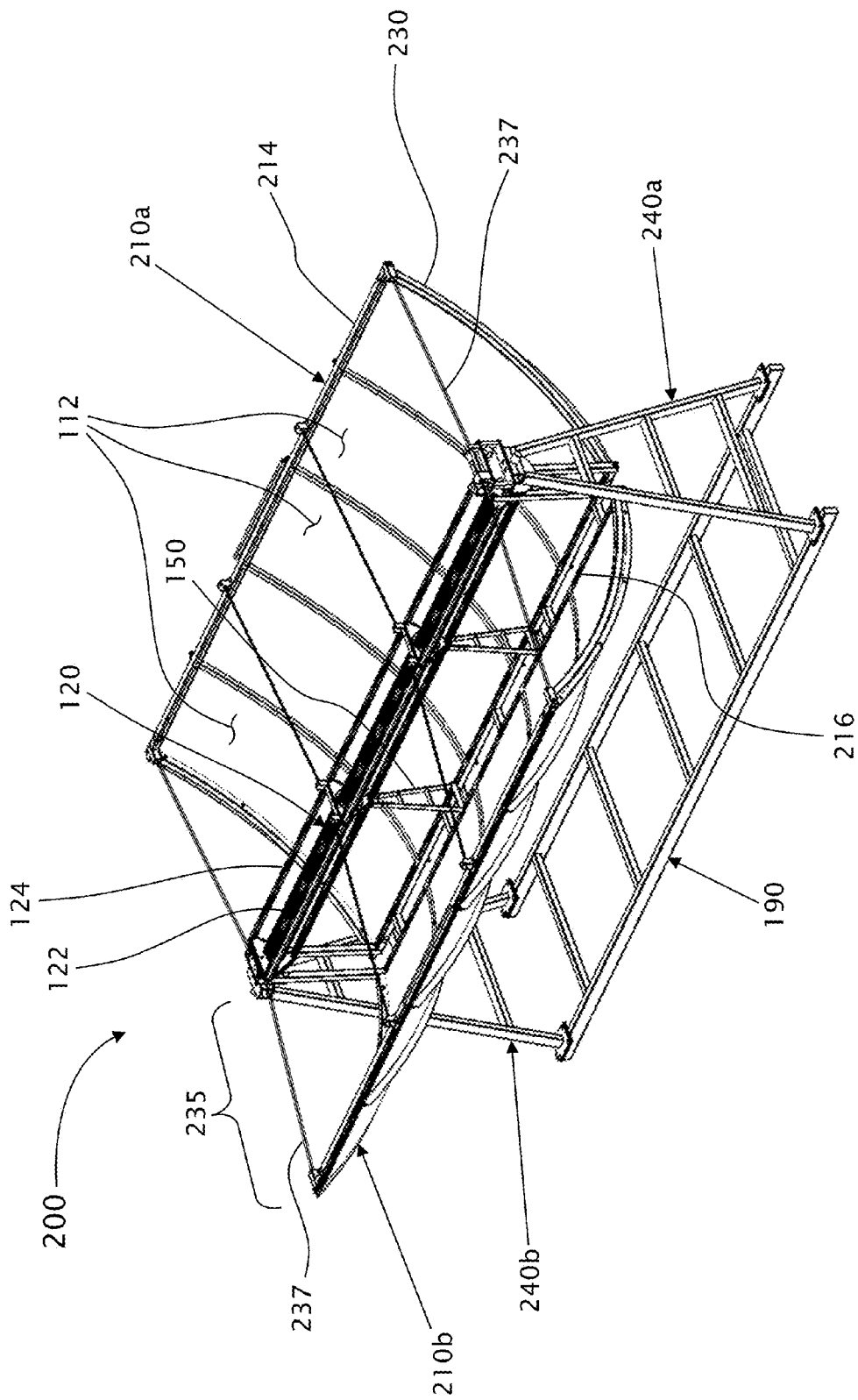
FIG. 31 is an isometric view illustration of a variation of the modular solar system for collecting solar energy shown in FIG. 15.

Reference is also now made to FIG. 31, an isometric view illustration of a variation 200 of modular solar system 100. In this embodiment, the support structure includes longitudinal bars 214, ladder-bar 216, a pair of stands 240, a pair of enclosing bars 230 and optionally, cross bars 237.

To tighten a row of individual-collectors 112 together, a tie-rod assembly is, for example, used. Elongated tie-rods 302 (see FIG. 20) is fittingly passed through respective threading-tubes 174 and through respective holes 231, formed at corresponding preconfigured locations in cross bars 237, to coincide with the respective apertures 172 of the adjacent individual-collector 112, and optionally, are securely tightened to the respective cross bar 237. Hence, each collector-assembly 210 is securely framed by a longitudinal bar 214, ladder-bar 216 and a pair of enclosing bars 230.

Figure 32:
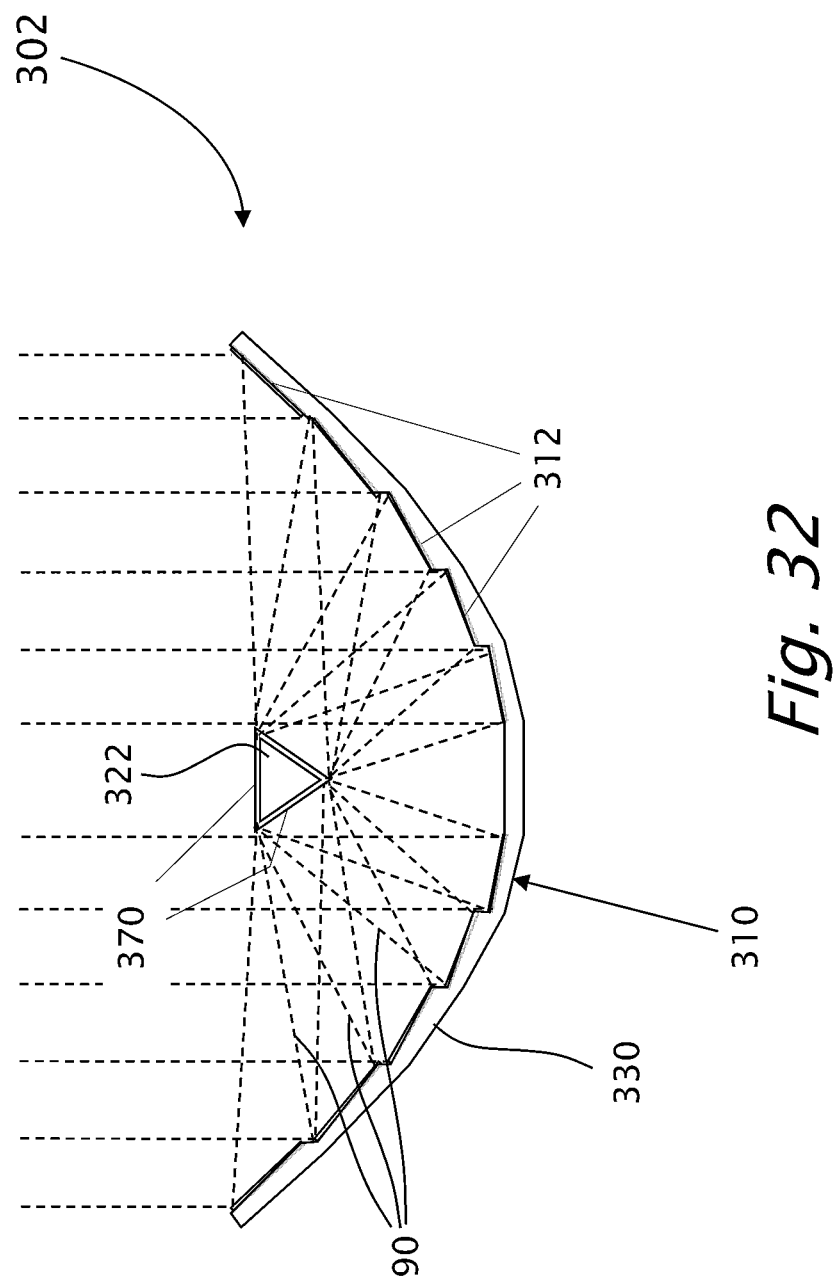
FIG. 32 is a non-dimensionally scaled, cross-sectional, side view illustration of a concentrated solar system for collecting solar energy, according to some embodiments of the present invention, wherein the receiver unit includes Photo-Voltaic panels.

Reference is now made to FIG. 32 which is a simplified diagram of concentrating solar photo-voltaic system, illustrating a cross sectional view of an embodiment of a solar collector 310 with photo-voltaic panels 370 affixed to the receiver. Energy reflected from the collector's panels 312 first impacts the photo-voltaic panels 370 which absorb a fraction of the energy according to the efficiency of photo-voltaic panels 370. Most of the remaining energy is collected by a receiver 722 to be used for heating working fluid 66 for any of the applications herein described.

An alternative to the active cooling by a liquid is air cooling. There are several configurations in which such cooling could be accomplished including using natural convection and fan-forced air cooling. In natural convection cooling, the heated PV panel heats up the air next to it. Since this air is hotter and thus less dense than the air above it, it has a natural tendency to rise. Advantage could be taken of this natural convection to induce much air from below to pass by the PV panel, thus cooling it. Forced fan convection is easier to understand and virtually any configuration in which a fan or a plurality of fans blow air across the heated panels for cooling purposes is included in this disclosure. One example includes the use of fans at either or both ends of a triangular arrangement of the PV panels as described above to induce air to flow across the shadow side of the panels.

Figure 33A:
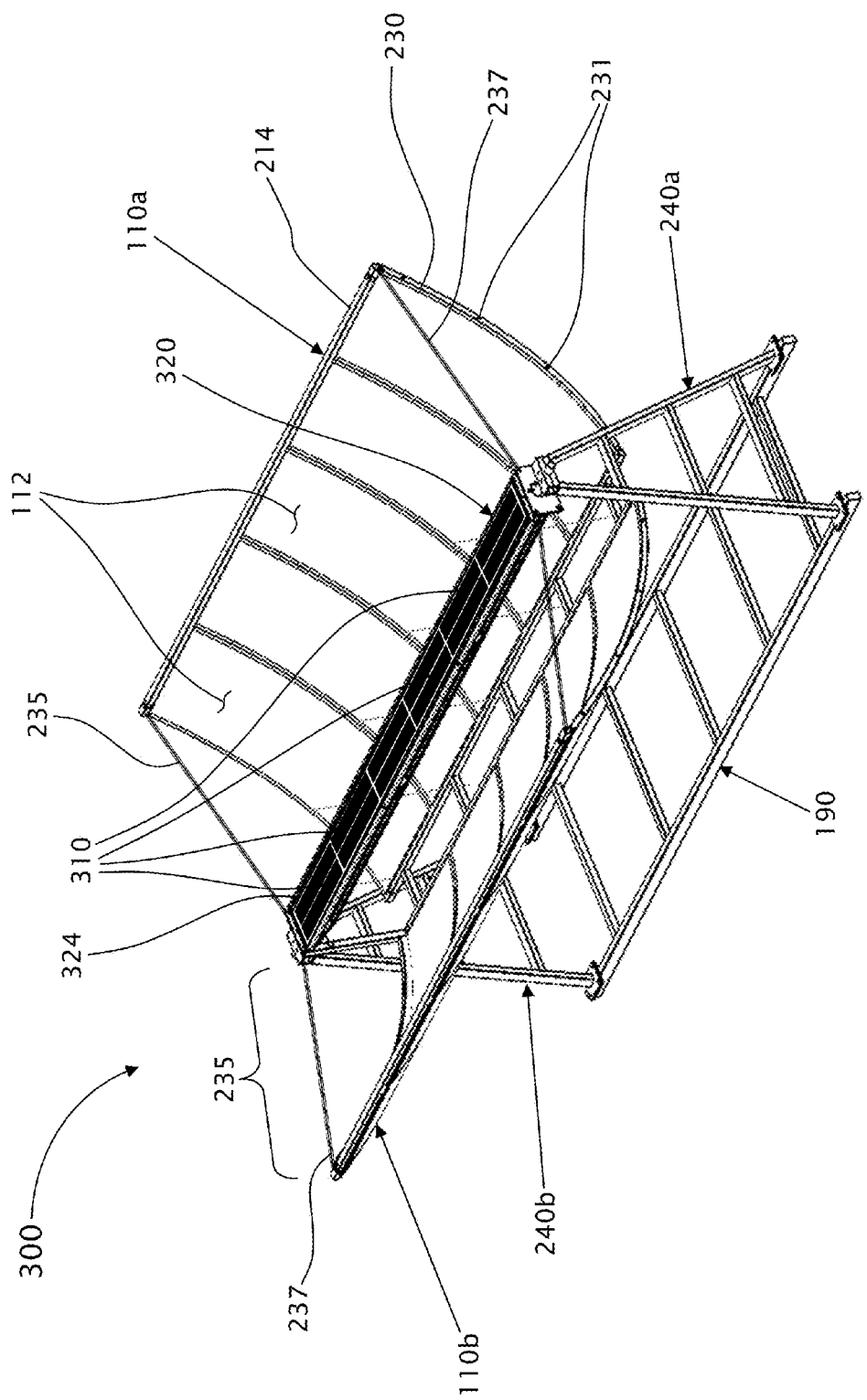
FIG. 33a is an isometric view illustration of another variation of the modular solar system for collecting solar energy, wherein the receiver unit includes PV panels.
Figure 33B:
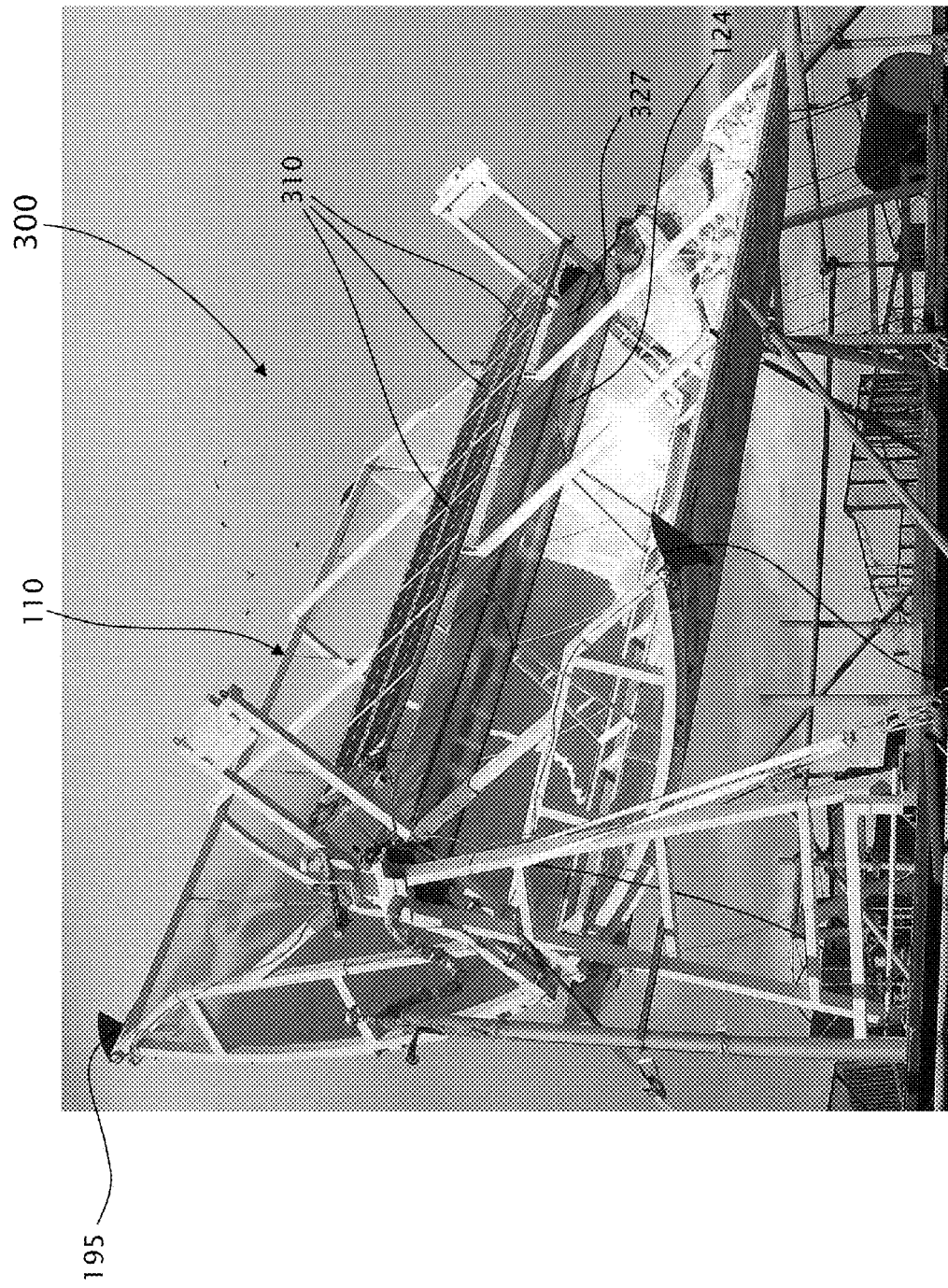
FIG. 33b depicts a solar system, as shown in FIG. 33a, having a PV panel.

Reference is also now made to FIG. 33a, an isometric view illustration of another variation 300 of the modular solar system 100 for collecting solar energy, wherein the receiver 320 includes PV panels 310. FIG. 33b depicts an example solar system, similar to the system shown in FIG. 33a, having PV panels 310. Optionally, PV panels 310 generate electricity that may be used to power the pump and control system of the modular solar system 300.

FIG. 33b also depicts a variation of receiver 320, wherein the first face of the prism shaped receiver-housing 124, that faces away from collector assembly 110, is enclosed by an insulating cover 327 made of heat insulation materials (similar to thermal insulation 927). Insulating cover 327 prevents loss of collected energy through the glass panel of the first face of the prism shaped receiver-housing 124, in particular, energy collected via the greenhouse effect. It also helps block radiated energy because it has a foil surface.

Figure 35:
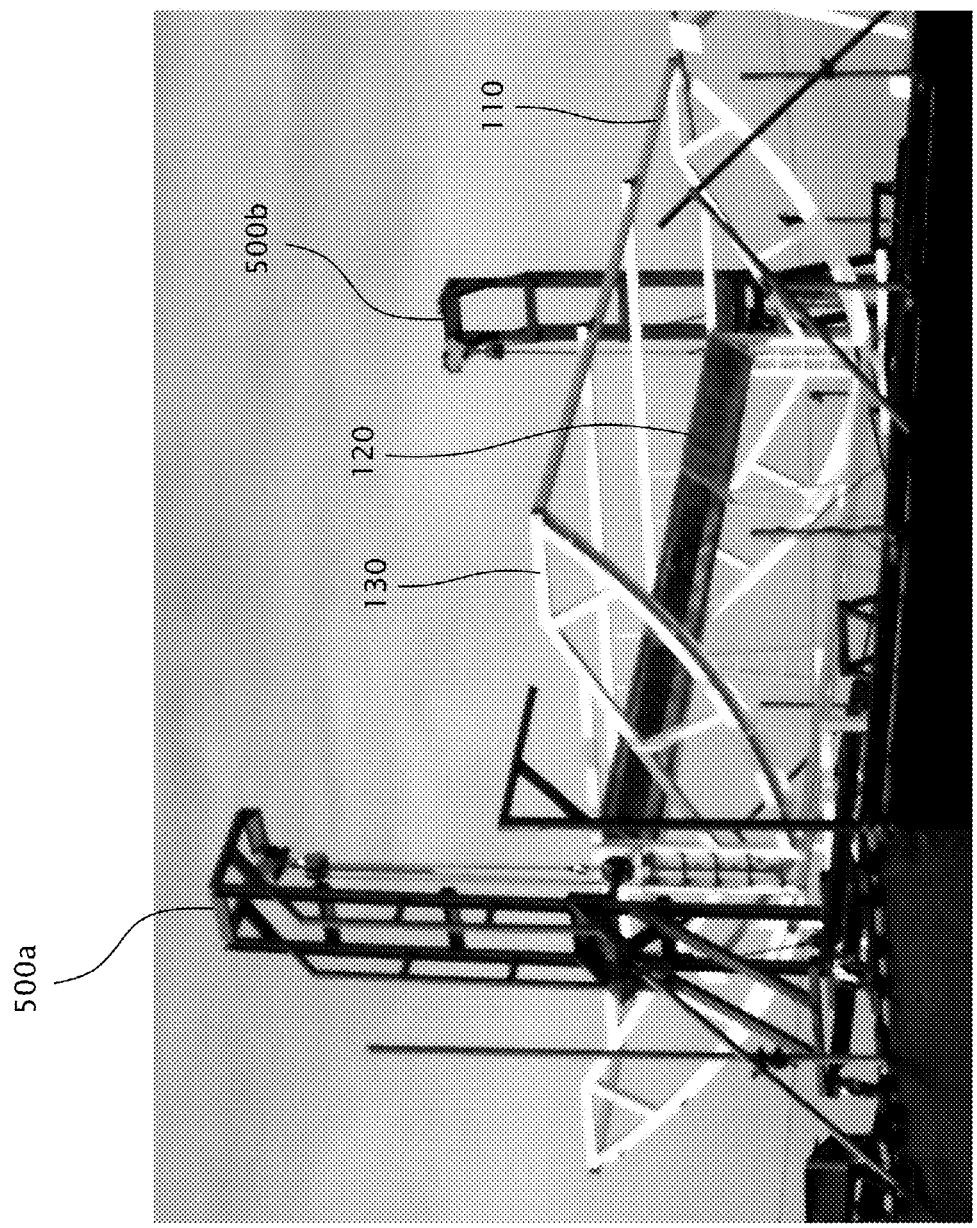
FIG. 35 depicts a partially assembled modular solar system, as shown in FIG. 15, partially assembled modular solar system being suspended between two cranes.
Figure 36:
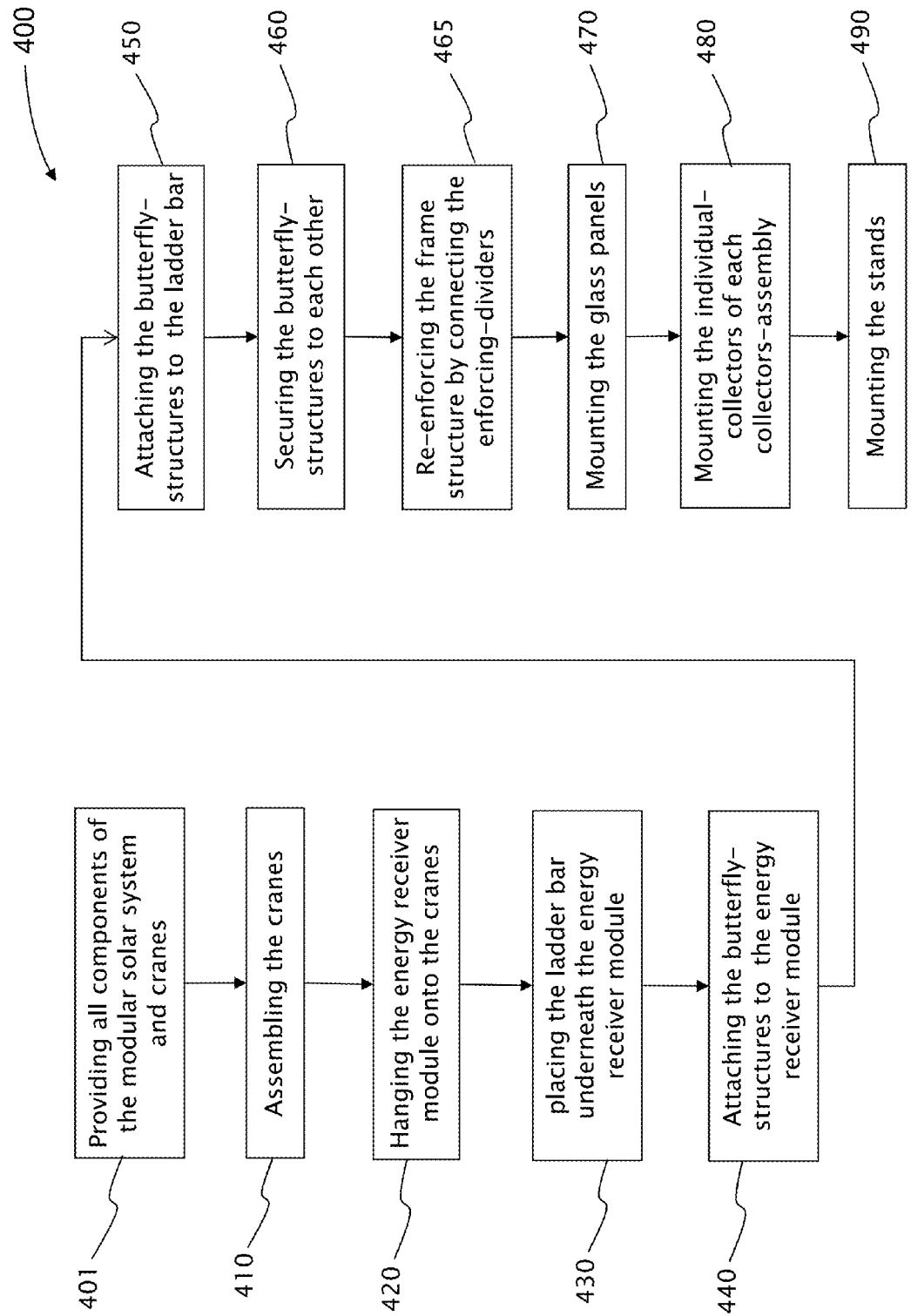
FIG. 36 is a flow-chart diagram outlining an exemplary assembly method for erecting a modular solar system, as shown in FIG. 15, utilizing a pair of cranes as shown in FIGS. 34-35, according to embodiments of the present invention.

An aspect of the present invention is to provide, as outlined in FIG. 36, an assembly method 400 for erecting a modular solar system 100, as shown in FIG. 15, including in an open field and in remote locations. For example, an on-site assembly of a modular solar system 100, dimensioned 6×4.5 m (as seen in FIG. 35), may be performed by 2 persons in about one working day.

Figure 34:
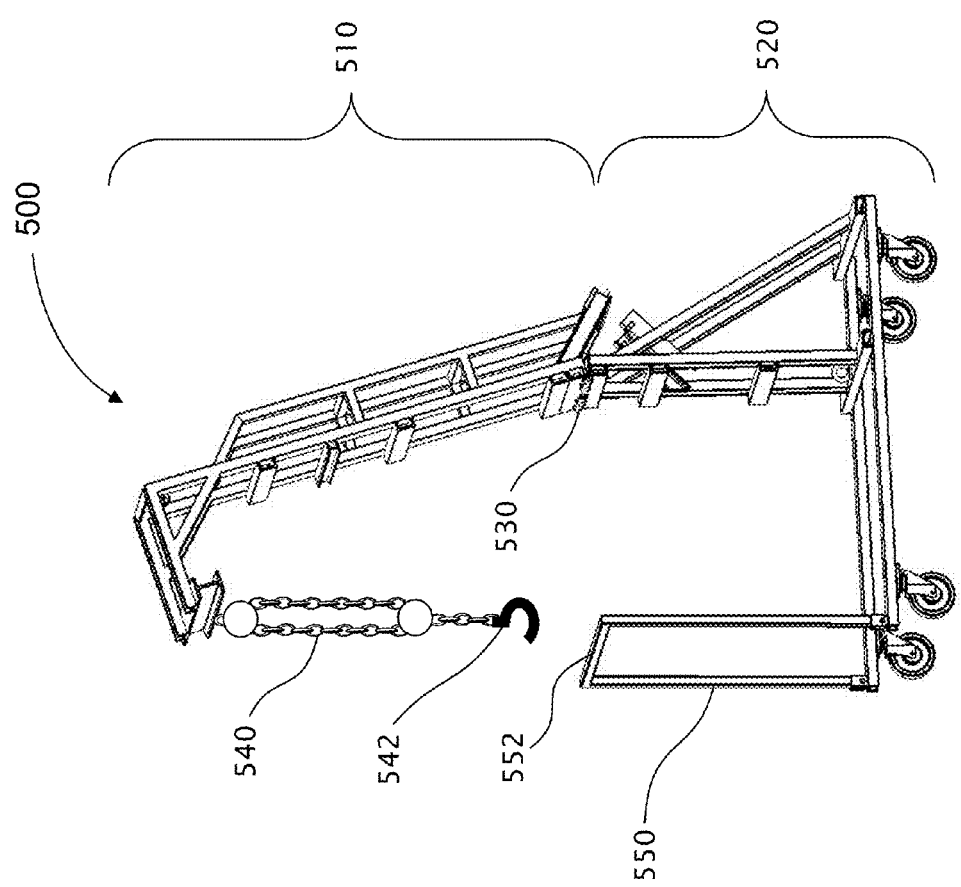
FIG. 34 illustrates a foldable crane, used for erecting a modular solar system, as shown in FIG. 15, according to variations of the present invention.

Initially, all components of modular solar system 100 are provided in step 401. Preferably, the components of modular solar system 100 and of cranes 500 have a small enough form to be shipped by land vehicles. Energy-receiving-module 120 is provided pre-assembled, preferably, without glass panels. Method 400 proceeds with the following steps:

Step 410: assembling cranes 500.
  FIG. 34 illustrates an example crane 500, used for erecting a modular solar system 100, the crane being almost erected. Preferably, at least two foldable cranes 500 are assembled, for example, by simply pivotally erecting, about hinges 530, and locking the top part 510 of foldable crane 500 on top of the bottom part 520 of crane 500, and folding down support bar 550. When folded, top part 510 of crane 500 leans on lateral bar 552 of support bar 550. Crane 500 is given by way of example only and other type of cranes may be used within the scope of the present invention. It should be noted that any other cranes may be used, including hydraulic cranes.

Step 420: hanging energy-receiving-module 120 on cranes 500.
  Energy-receiving-module 120 is lifted by cranes 500, for example, by hooking hooks 542 inside loops 137 (see FIGS. 23 and 25). The hanging of energy-receiving-module 120 and other assembled components is depicted in FIG. 35.

Step 430: placing ladder bar 116 underneath energy-receiving-module 120.
  Ladder bar 116 is placed underneath energy-receiving-module 120, at a preconfigured height.

Step 440: attaching side-structures 130 to energy-receiving-module 120.
  Side-structures 130 are securely attached to energy-receiving-module 120, for example, by attaching the top-inner corners of side-structures 130 at a respective position of plate 136, as shown in FIG. 25.

Figure 28:
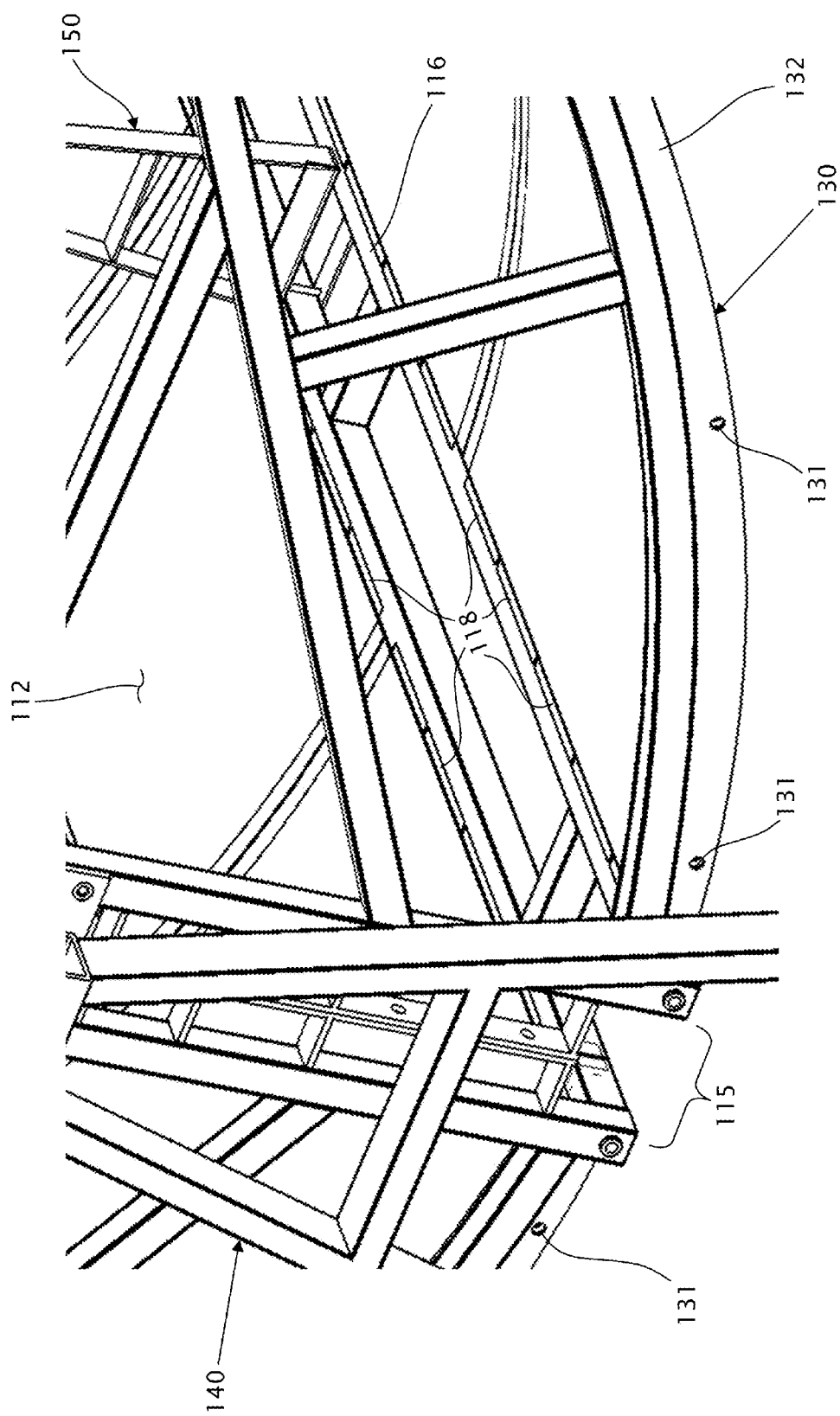
FIG. 28 is an isometric view illustration of a portion of the modular solar system shown in FIG. 15, showing an example ladder bar interconnecting the two rows of collectors.
Figure 29:
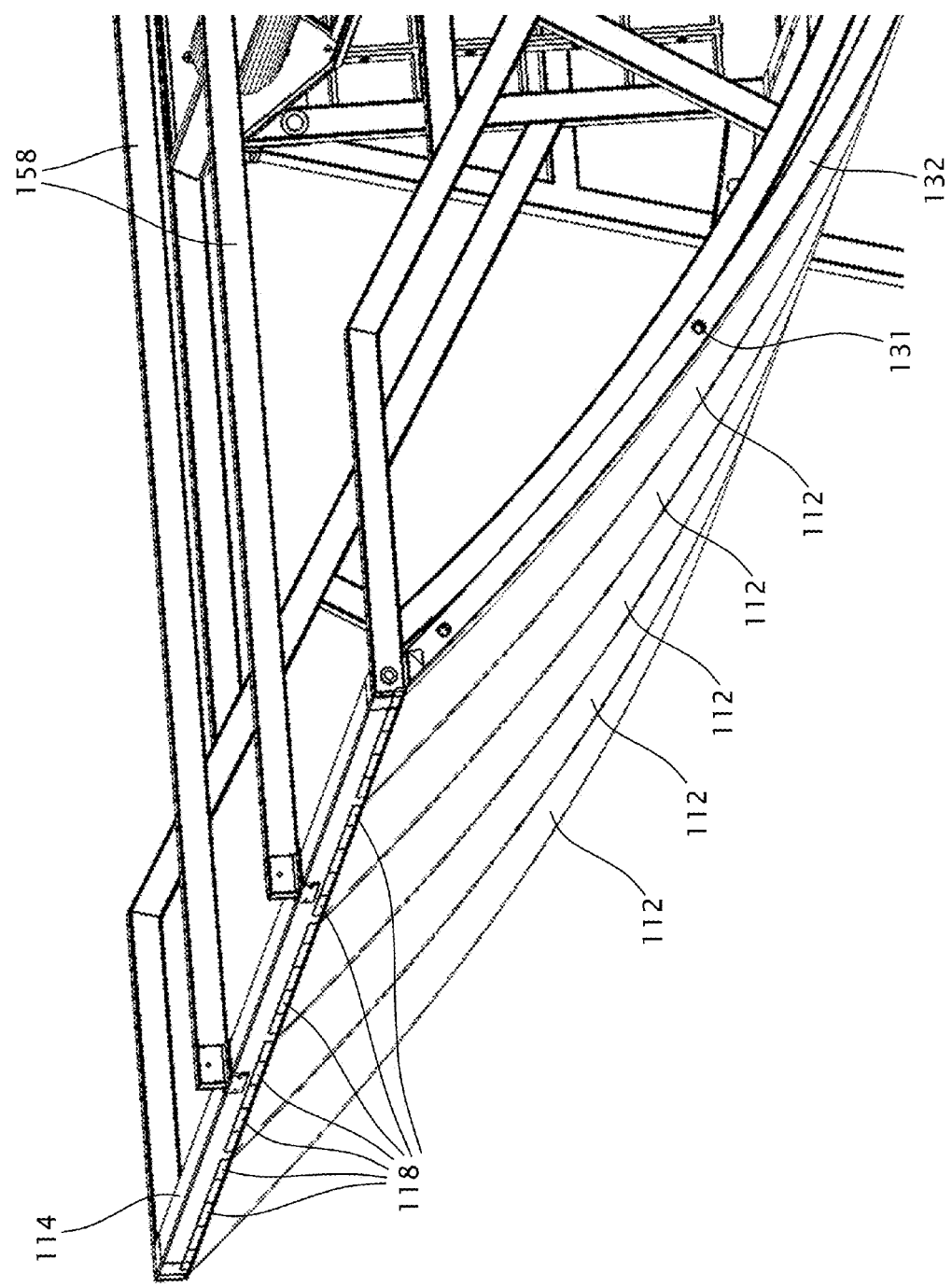
FIG. 29 is an isometric view illustration of a portion of the modular solar system shown in FIG. 15, showing the interrelation between the collectors and a collectors' tightening bar.

Step 450: attaching side-structures 130 to ladder bar 116.
  Side-structures 130 are securely attached to ladder bar 116, for example, by attaching the bottom-inner corners of side-structures 130 to a respective end of ladder bar 116, as shown in FIG. 28.

Step 460: securing side-structures 130 to each other.
  Side-structures 130 are securely attached to each other, by connecting longitudinal bars 114 to the top-outer corners of side-structures 130, as shown in FIGS. 15 and 16.

Step 465: re-enforcing the frame structure by connecting enforcing-dividers 126.
  The frame structure of modular solar system 100 is re-enforced by securely attaching the bottom section of each enforcing-dividers 126 to ladder bar 116 by a respective receiver-housing fixation structures 150. The top section of each enforcing-dividers 126 are securely connected to a respective cross bar 158, via structure spacers 156, wherein each cross bar 158 is securely attached to longitudinal bars 114.

Step 470: mounting glass panels of energy-receiving-module 120.
  Mounting glass panels and/or PV panels, onto receiver-housing 124 of energy-receiving-module 120.

Step 480: mounting the individual-collectors 112 of each collector-assembly 110.
  Mounting the individual-collectors 112 of each collector-assembly 110, between ladder bar 116 and longitudinal bars 114. By using flaps 118 (see FIGS. 17, 18, 20, 27, 28 and 29) and the enforced individual-collectors 112 fiberglass cast on the sheet-metal frame or by the foam-filled sheet-metal box, individual-collectors 112 further re-enforce the rigidity of the frame structure of modular solar system 100.

Step 490: mounting stands 140.
  Mounting stands 140 onto central pipe 123, at each side of energy-receiving-module 120, wherein the whole structure is still hanging on cranes 500.
  Crane 500 can then be operated to lower the structure until standing stable on mounting stands 140 at a preconfigured location.

An aspect of the present invention is to provide a protective mode for modular solar system 100, when modular solar system 100 is idle. In the protective mode of modular solar system 100, wings 135 are turned such that the receiving surfaces collectors 112 face the ground. This may occur, for example, during bad weather, at night, or during down time for emergency or maintenance. The protective mode of modular solar system 100 may reduce cleaning costs as less dust accumulates on collectors 112 and on the surfaces of the receiver-housing 124; may practically reduce dew formation to zero; and allows for easier maintenance and cleaning of the upside down collectors. It should be noted that the combination of dew and dust does make mud which is tough to remove.

It should be noted that the protective mode of modular solar system 100, gap 115 substantially reduces the lifting forces, when winds are blowing.

The invention being thus described in terms of embodiments and examples, it will be obvious that the same may be varied in many ways. Such variations are not to be regarded as a departure from the spirit and scope of the invention, and all such modifications as would be obvious to one skilled in the art are intended to be included within the scope of the claims.

What is claimed is:

1. A solar heating system for collecting solar energy, comprising:
   a) a parabolic trough-type solar energy collector-assembly, comprising two wings (135) each having at least one parabolic collector, wherein each collector comprises:
      i) a rigid body; and
      ii) a mirror-grade polished metal sheet or mirror-grade surface operatively facing the sun;
   b) an energy-receiving-module (120), adapted to absorb the solar energy, comprising:
      i) a receiver unit (122) having a body with a length ($l_r$), a preconfigured diameter ($d_r$), and an axis of rotation, wherein a series of working fluid flow passages allow selected working fluid to travel back and forth within said receiver unit, wherein said flow passages are arrayed around the axis of rotation and may be oriented in a circular geometry, proximal to the external surface of said receiver unit; and
      ii) an elongated, substantially transparent, receiver-housing (124), having a generally triangular prism shape, wherein a first face of said receiver-housing faces away from said wings, and each of the second and third faces of said receiver-housing face respectively at least one parabolic collector, having substantially the same length as said receiver unit;
   c) a shaft;
   d) a support structure, including a stand to be disposed on a substantially rigid surface;
   e) a control-subsystem;
   f) a modulated flow temperature controlled pump;
   g) a rotating mechanism; and
   h) a sun-following mechanism coupled to operate with said control-subsystem,
wherein said receiver (600) comprises an extruded body (610) having an external surface (612) and two open ends; wherein said two open ends are sealingly enclosed by a pair of fitted caps (620); wherein said extruded body is a pipe having an inner space (640) formed by an inner surface (642), and wherein said extruded body comprises a multiplicity of passageways (662, 664, 650) separated by internal walls (670, 672), disposed longitudinally between said two open ends; and wherein said passageways are interconnected to form a single elongated-passageway having one flow-inlet (650) and one flow-outlet being in flow communication with fitted openings formed in said caps;
wherein said at least one parabolic collector collects the solar energy from the sun;
wherein said collected energy is directed at the external surface of the receiver unit, as indicated by the sun-following mechanism; and
wherein said collected energy that is directed at the external surface of said receiver unit forms a pair of solar energy strips along the external surface of said receiver unit, each strip having a width $d_e$, wherein $d_e < d_r$, to thereby allow a relaxed solar tracking error.

2. The solar heating system as in claim 1, wherein said receiver unit has a generally circular lateral cross section, wherein said shaft is a stationary shaft;
wherein said collector-assembly is securely attached to said support structure that is pivotally attached to said stationary shaft; and
wherein said control-subsystem is adapted to activate said rotating mechanism in order to pivotally position said collector-assembly, with respect to said shaft, such that said collectors face the sun during daylight hours, and the collected energy is directed at the external surface of said receiver unit, as indicated by said sun-following mechanism.

3. The solar heating system as in claim 2 further comprising a braking sub-system configured to lock the pivotal motion of said support structure about said stationary shaft, when said sun-following mechanism is not in operation.

4. The modular solar system as in claim 2, wherein said receiver unit is securely mounted onto or is part of said stationary shaft, and wherein said stationary shaft is adapted to facilitate said working fluid to flow in and out of said receiver unit.

5. The solar heating system as in claim 2, wherein said support structure comprises a pivotal-mechanism, such as bearings (160), adapted to allow pivotal motion of said support structure about said stationary shaft, and wherein said control-subsystem is adapted to activate said rotating mechanism in order to pivotally position said collector-assembly, with respect to said stationary shaft.

6. The solar heating system as in claim 5, wherein multiple solar heating systems are connected axially together and driven by said sun-following mechanism.

7. The solar heating system as in claim 5, wherein said relaxed solar tracking error facilitates intermittent solar tracking, wherein said control-subsystem activates said rotating mechanism in order to pivotally position said collector-assembly, with respect to said stationary shaft, according to the accumulated tracking error, at a selected time interval, selected such that said solar energy strips remain within the diameter boundary of said receiver unit.

8. The solar heating system as in claim 5, wherein multiple solar heating systems are connected axially together and driven by one of said control-subsystem.

9. The solar heating system as in claim 1, wherein the system is a modular system adapted to be assembled on-site, and wherein said at least one parabolic collector is assembled from a number of substantially identical individual-collectors, arranged in at least one row.

10. The solar heating system as in claim 9, wherein each of said individual-collectors further comprises at least one laterally disposed threading-tube (174), integrated into said rigid body, and wherein said solar collector-assembly further comprises at least one tie-rod (302),
wherein each of said lateral threading-tubes forms an elongated-open-tube, when said individual-collectors are arranged in a row; and
wherein each of said tie-rods is inserted through a respective elongated-open-tube and is tightly secured to said support structure.

11. The solar heating system as in claim 1, wherein said receiver unit is disposed at the center of gravity of said pivotal collector-assembly.

12. The modular solar system as in claim 1, wherein said collector-assembly is enclosed by a highly transparent, substantially flat cover (818).

13. The modular solar system as in claim 1, wherein a gap (115) is formed between said two wings.

14. The modular solar system as in claim 1, wherein said solar energy reflected from each of said collector units form a beam having an upper boundary beam (92), coming from the top of said collector unit, and a lower boundary beam (94), coming from the bottom of said collector unit, and wherein said second and third faces of said prism shaped receiver-housing form substantially the same angle ($\alpha$) with said upper and lower boundary beams.

15. The modular solar system as in claim 1, wherein said prism shaped receiver-housing is securely attached to said support structure and thereby pivots along with said collector-assembly, while said receiver unit remains stationary.

16. The modular solar system as in claim 1, wherein said faces of said prism shaped receiver-housing are enclosed by substantially transparent materials, such as glass.

17. The modular solar system as in claim 1, wherein heat insulation material is disposed between said first face of said prism shaped receiver-housing and said receiver unit, and wherein said insulation comprises foil surface nearest to said receiver unit.

18. The modular solar system as in claim 1, wherein heat insulation material is disposed between faces of said prism shaped receiver-housing and non-illuminated regions of said receiver unit, such as the bottom region (96) of said receiver unit.

19. The modular solar system as in claim 1, wherein either PV panels are securely attached onto the external surface of said first face of said prism shaped receiver-housing, or said faces of said prism shaped receiver-housing are enclosed by PV panels, being said energy-receiving-module.

20. The modular solar system as in claim 1, wherein said control-subsystem is adapted to control the flow rate of said selected working fluid within said receiver unit, to thereby keep the temperature of said selected working fluid within a predetermined range.

21. The modular solar system as in claim 1, wherein said passageways are arranged in pairs,
wherein each pair of said passageways is bounded by sealed walls (670) and wherein said pair of passageways is separated by a nibbled-wall (672), facilitating flow of fluid between said passageways of said pair of passageways; and
wherein an internal wall, that is a sealed wall at one of said open ends of said extruded body, is a nibbled wall at the other open end of said extruded body, to thereby form said single elongated-passageway, when enclosed by said caps.

22. The modular solar system as in claim 21, wherein inner-pipes are inserted through said passageways, wherein said inner-pipes are interconnected and sealed by a connecting member (692) disposed in the space formed at said nibbled-wall to thereby form a single elongated pipe (690), having a first end (652) passing through said flow-inlet (650) and connected to said fitted opening formed in a first of said caps, and second end (652) passing through said flow-outlet (650) and connected to said fitted opening formed in the second of said caps.

23. The modular solar system as in claim 1, wherein said caps comprise pairing members (625), integrated therein, and wherein each of said pairing members is adapted to sealingly enclose preconfigured pairs of said passageways, facilitating flow of fluid between said passageways of said pair of passageways, when enclosed by said caps; and
wherein said pairing members (625), of a respective one of said caps, is configured to enclose non-overlapping adjacent pairs of said passageways, with respect to said pairing members of the other of said caps, to thereby form said single elongated-passageway.

24. The modular solar system as in claim 1, wherein said extruded body further comprises an alignment hollow cavity (680), formed at said open ends facilitating fast and error-free enclosure of said pair of caps.

25. The modular solar system as in claim 1, wherein said energy-receiving-module further comprises a flat, substantially reflective end-reflector (119) having a reflective surface and disposed at a preconfigured end of said collector-assembly,
wherein said end-reflector is protruding generally towards the sun;
wherein said reflective surface faces the reflective surface of the respective collector; and
wherein, when at lower sun angles, some of the sun's rays (11) reflected back from said reflective end-surface to said receiver unit.

26. The modular solar system as in claim 1, wherein said individual-collectors are fabricated by molding from materials selected from the group including polymers and fiberglass.

* * * * *